United States Patent [19]
Nelson et al.

[11] Patent Number: 5,459,634
[45] Date of Patent: * Oct. 17, 1995

[54] AREA ARRAY INTERCONNECT DEVICE AND METHOD OF MANUFACTURE THEREOF

[75] Inventors: Gregory H. Nelson, Gilbert; Steven C. Lockard, Phoenix, both of Ariz.

[73] Assignee: Rogers Corporation, Rogers, Conn.

[ * ] Notice: The portion of the term of this patent subsequent to Oct. 1, 2008 has been disclaimed.

[21] Appl. No.: 973,229

[22] Filed: Nov. 6, 1992

Related U.S. Application Data

[63] Continuation of Ser. No. 767,228, Sep. 27, 1991, abandoned, which is a continuation-in-part of Ser. No. 601,927, Oct. 23, 1990, Pat. No. 5,053,921, which is a continuation-in-part of Ser. No. 352,112, May 15, 1989, Pat. No: 4,995,941.

[51] Int. Cl.[6] .................................................. H01G 4/40
[52] U.S. Cl. ................... 361/306.3; 361/794; 361/715; 257/668; 257/669; 216/20; 216/18
[58] Field of Search ........................... 361/306.1, 761, 361/763, 772, 777, 780, 794, 795, 771, 774, 810; 174/262, 263, 266; 257/786

[56] References Cited

U.S. PATENT DOCUMENTS

| | | | |
|---|---|---|---|
| 4,159,222 | 6/1979 | Lebow et al. | 156/632 |
| 4,237,606 | 12/1980 | Niwa et al. | 29/830 |
| 4,306,925 | 12/1981 | Lebow et al. | 29/848 |
| 4,357,203 | 11/1982 | Zelez | 156/643 |
| 4,420,364 | 12/1983 | Nukii et al. | 29/846 |
| 4,437,141 | 3/1984 | Prokop . | |
| 4,473,737 | 9/1984 | Anthony | 219/121 |
| 4,498,122 | 2/1985 | Rainal | 174/264 |
| 4,568,632 | 2/1986 | Blum et al. | 430/945 |
| 4,598,039 | 7/1986 | Fischer et al. | 219/121 |
| 4,642,160 | 2/1987 | Burgess | 29/852 |
| 4,685,998 | 8/1987 | Quinn et al. | 156/633 |
| 4,705,917 | 11/1987 | Gates et al. | 174/52 FP |
| 4,744,007 | 5/1988 | Watari et al. . | |
| 4,903,113 | 2/1990 | Frankeny et al. | 361/361.1 |
| 4,922,325 | 5/1990 | Smeltz, Jr. | 174/266 |
| 4,972,253 | 11/1990 | Palino et al. . | |
| 4,991,001 | 2/1991 | Takubo et al. | 333/247 |
| 5,066,831 | 11/1991 | Spielberger et al. . | |
| 5,067,004 | 11/1991 | Marshall et al. | 357/71 |

FOREIGN PATENT DOCUMENTS 0256778 2/1988 European Pat. Off. .

*Primary Examiner*—Leo P. Picard
*Assistant Examiner*—Michael D. Switzer
*Attorney, Agent, or Firm*—Fishman, Dionne & Cantor

[57] ABSTRACT

An area array interconnect device (such as of the TAB type) has a plurality of input/output (I/O) leads for connection to an electronic device such as an IC. The interconnect device also has arrays of lead lines in areas remote from the I/O leads, e.g., central or internal areas, which are connected by vias to ground and/or power pads on corresponding areas of the electronic device.

46 Claims, 41 Drawing Sheets

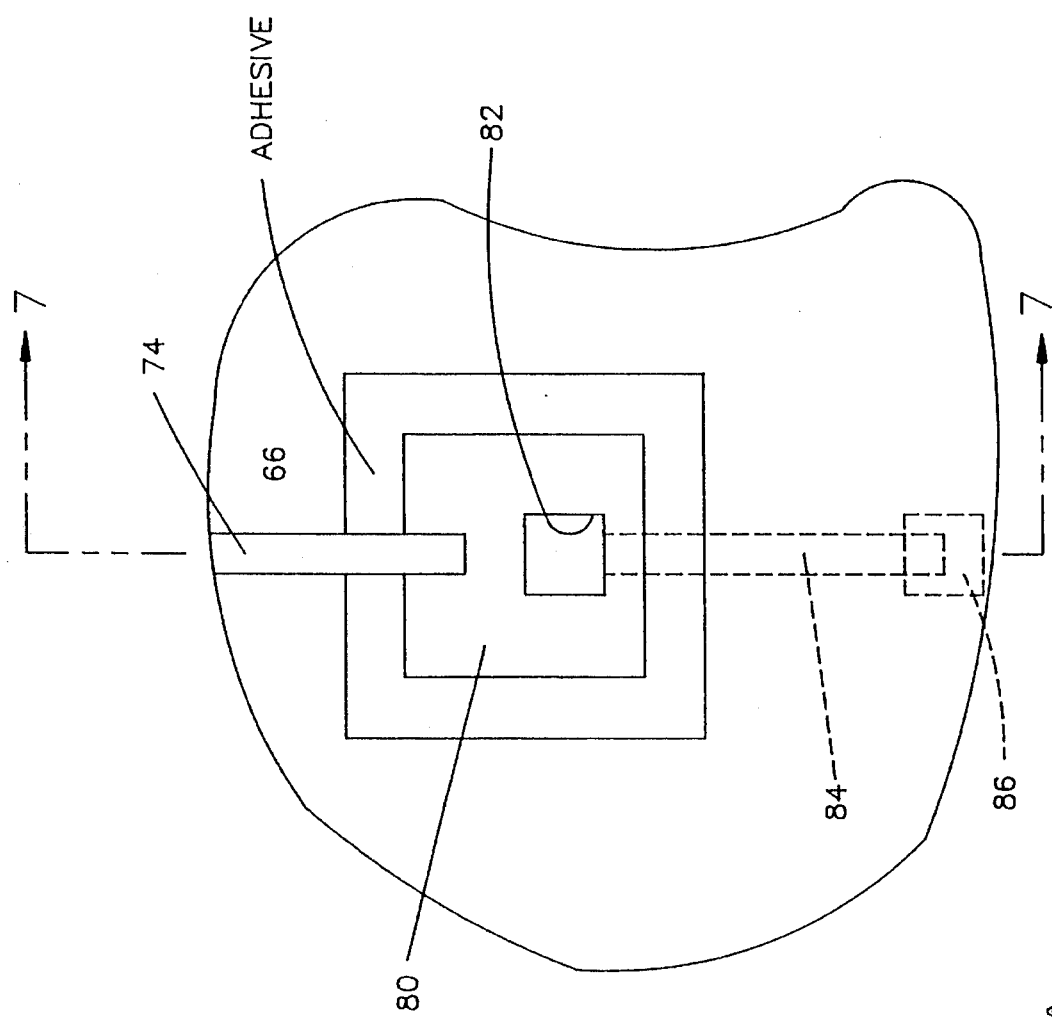

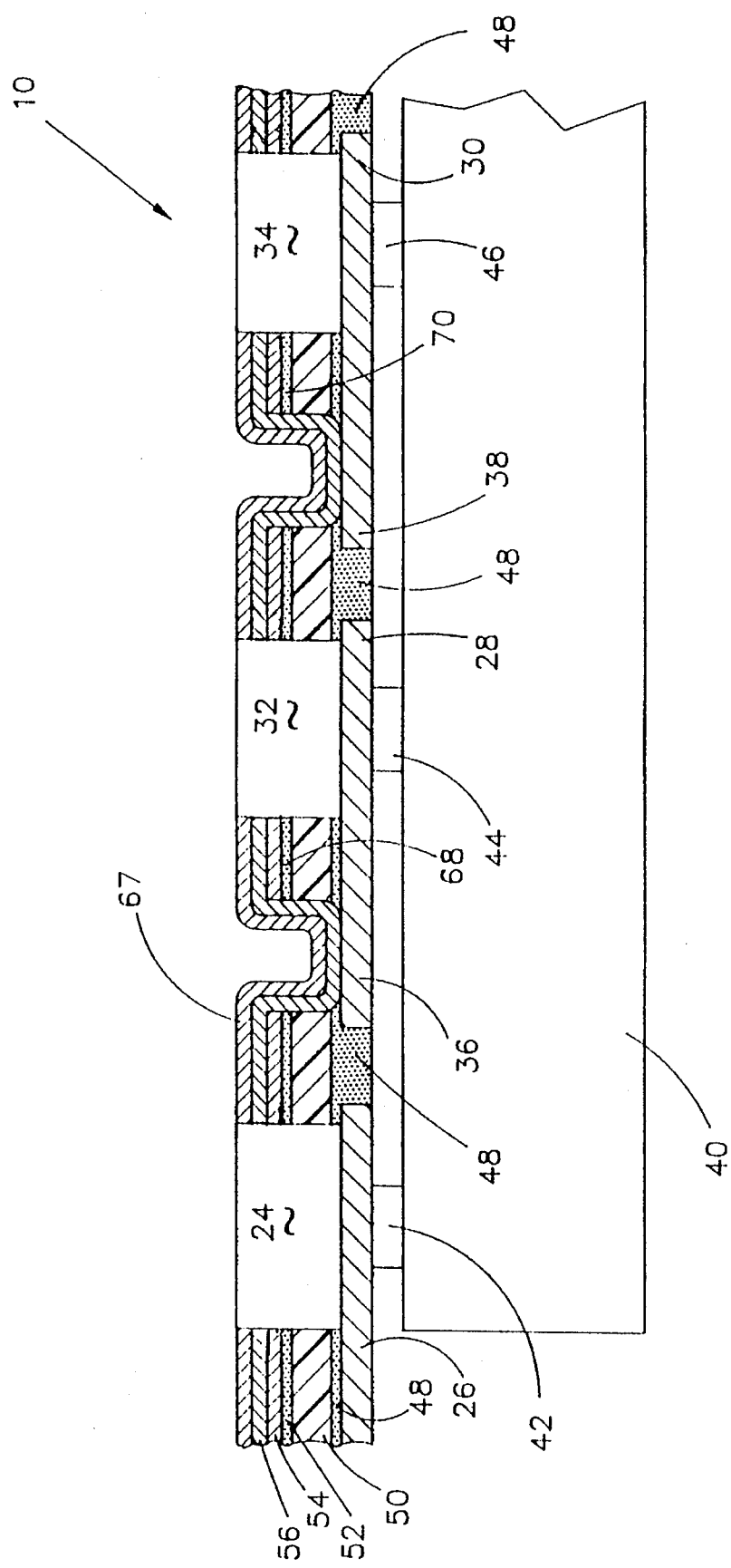

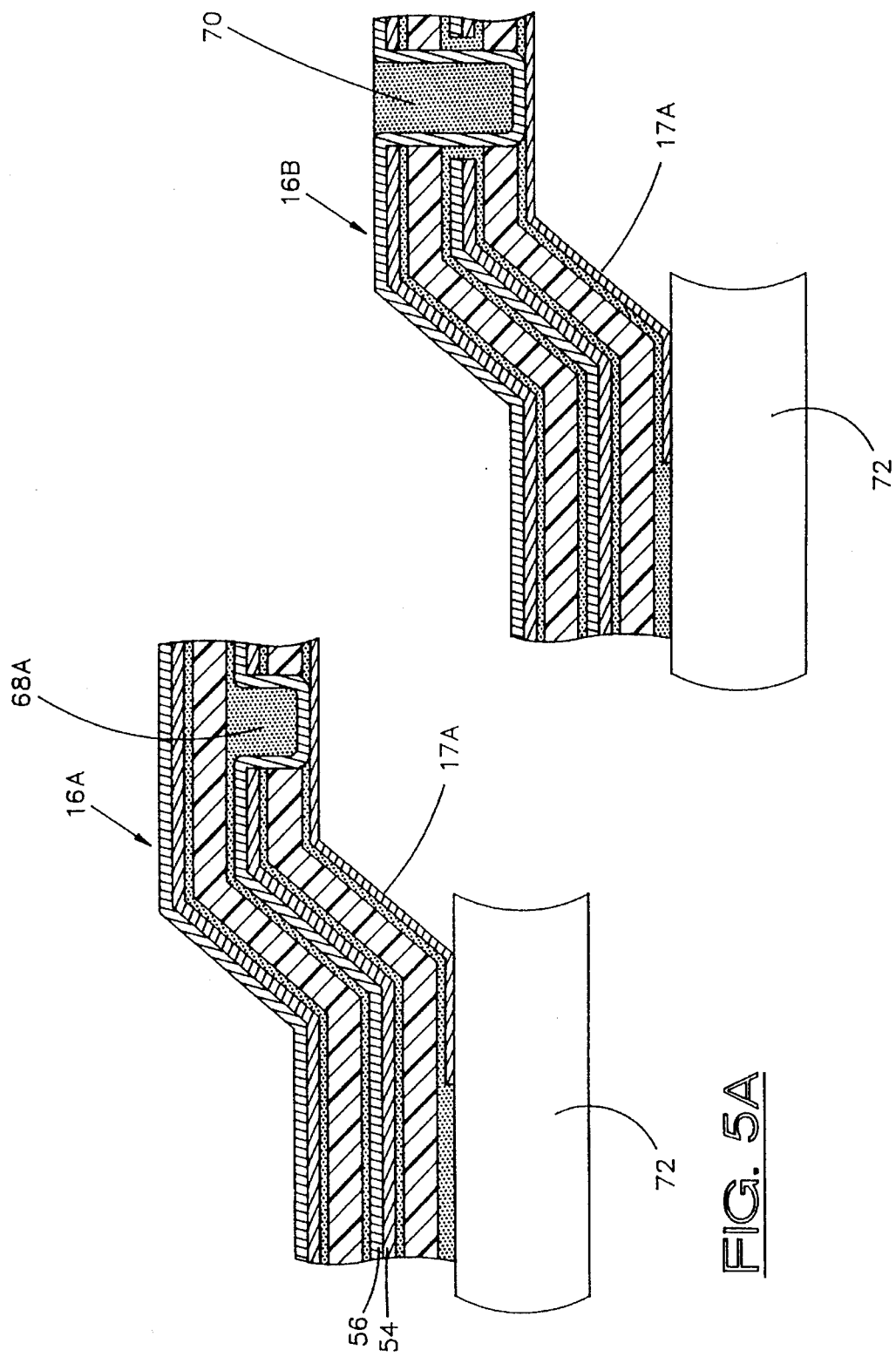

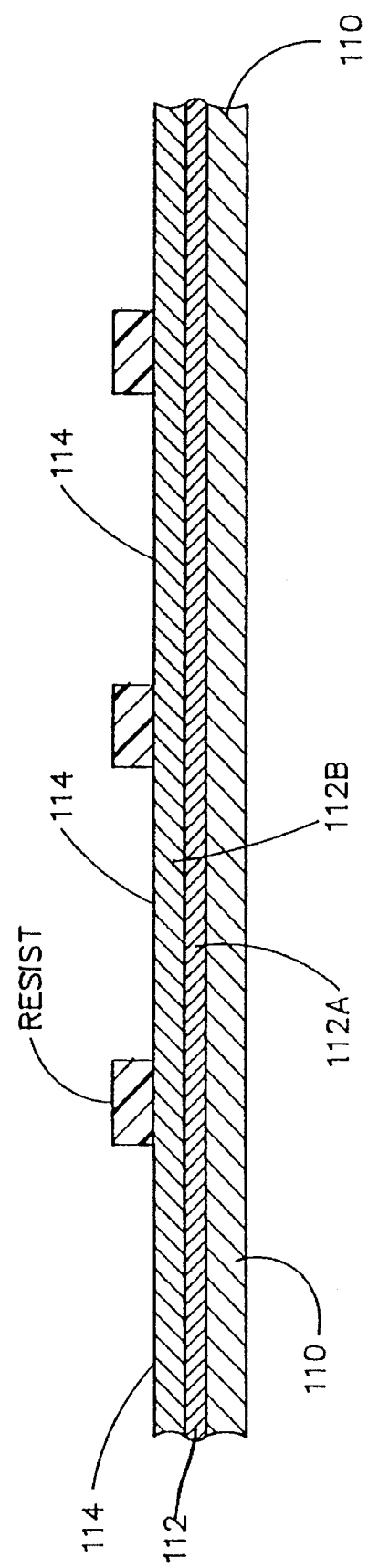

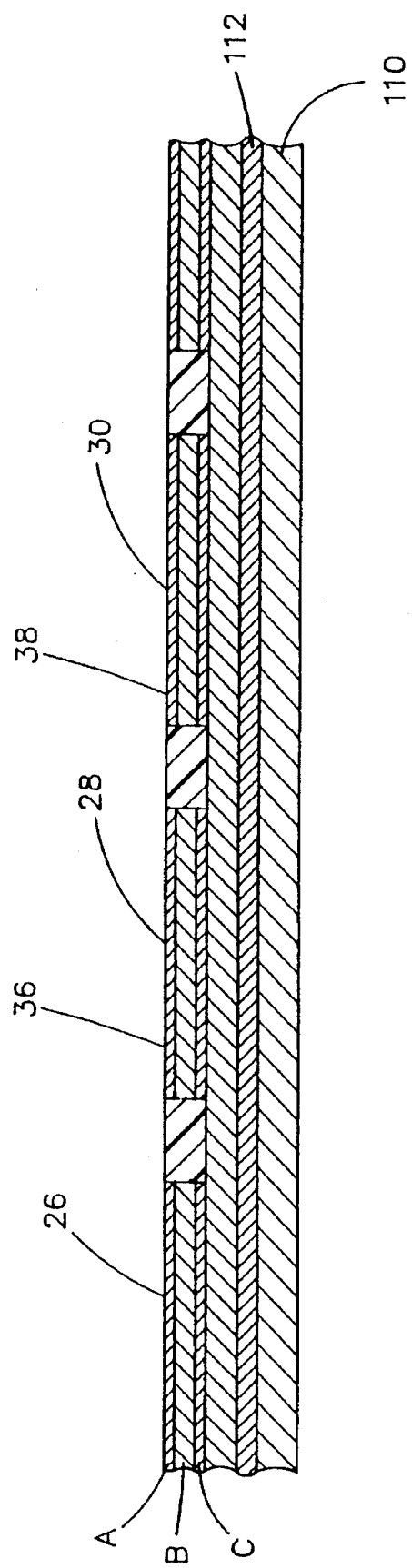

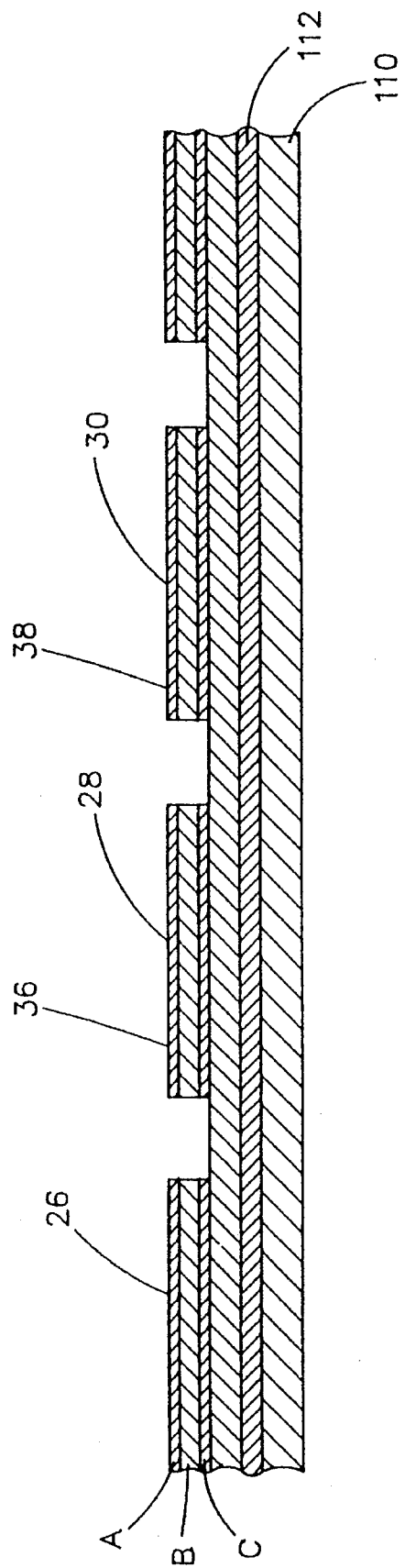

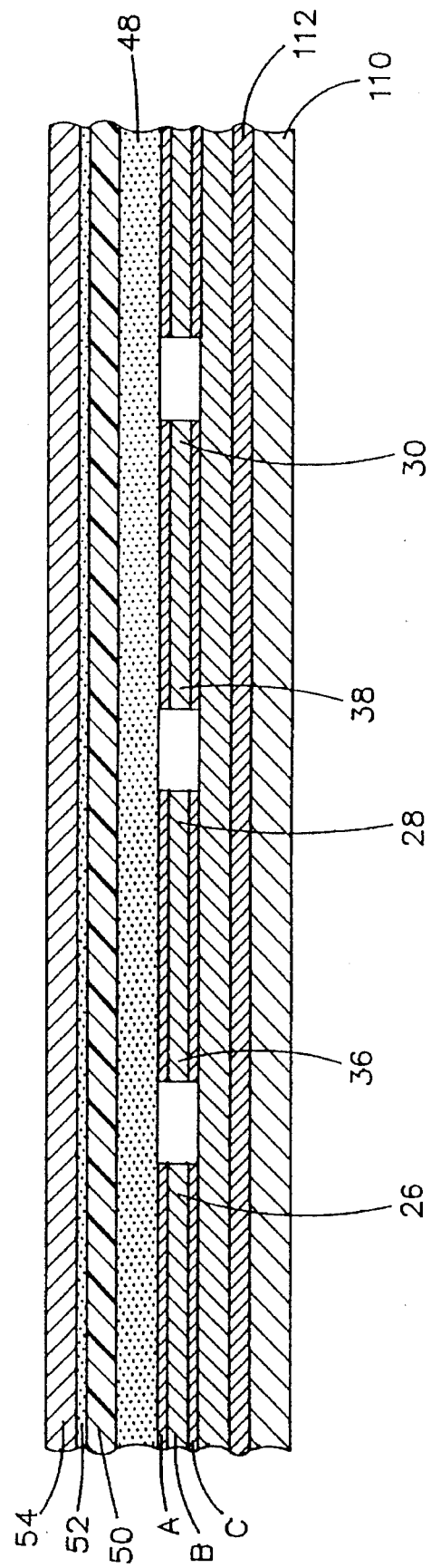

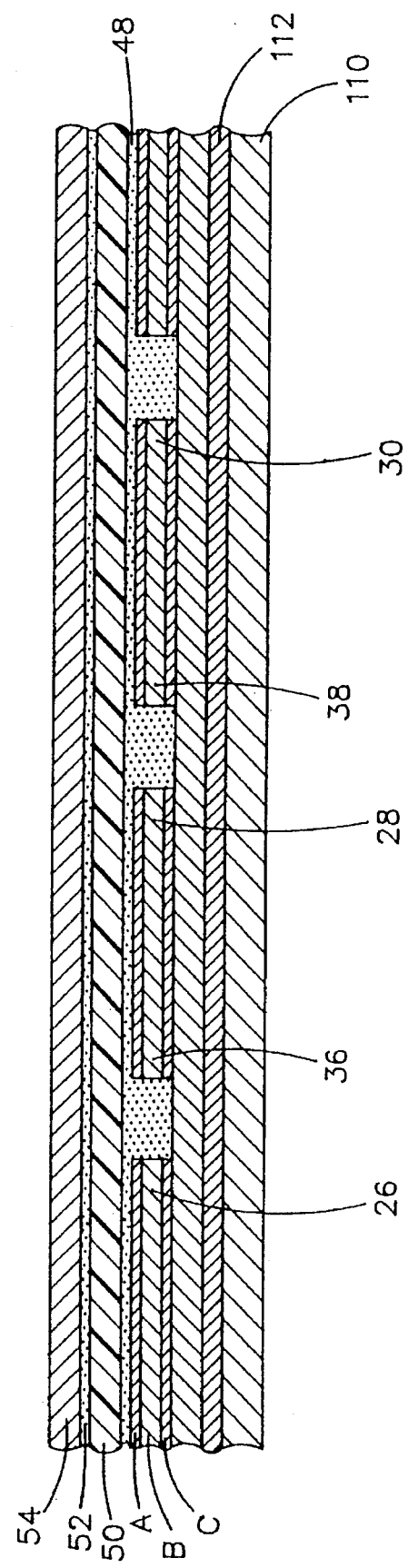

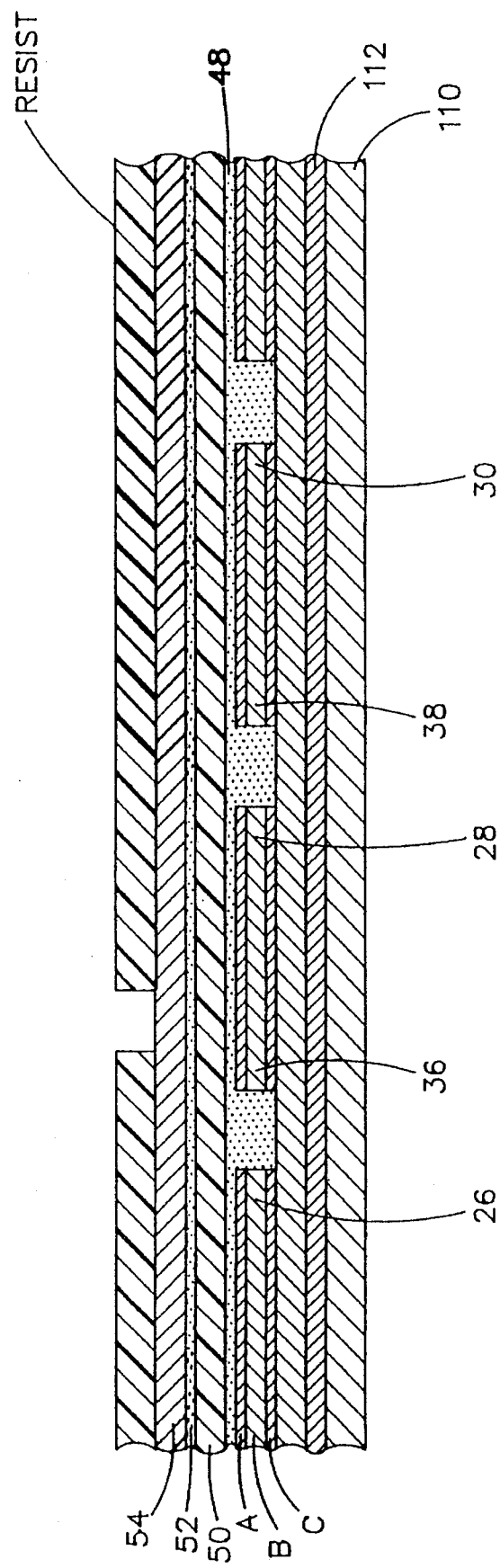

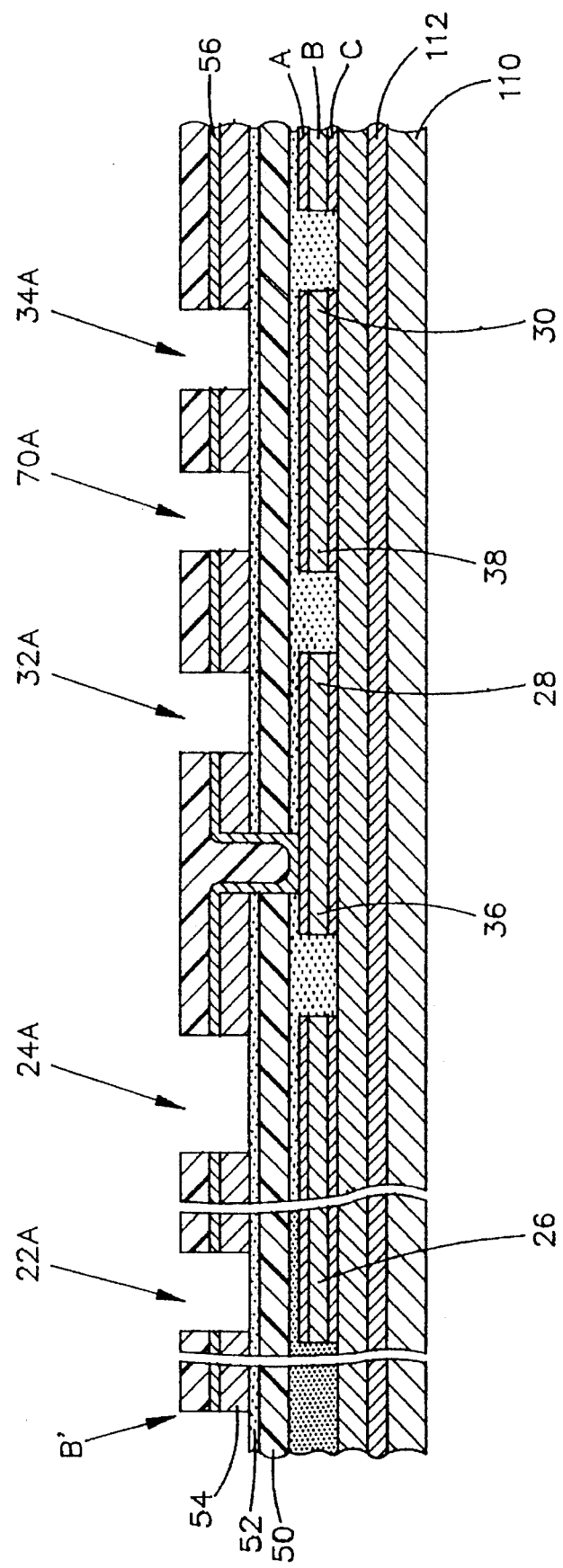

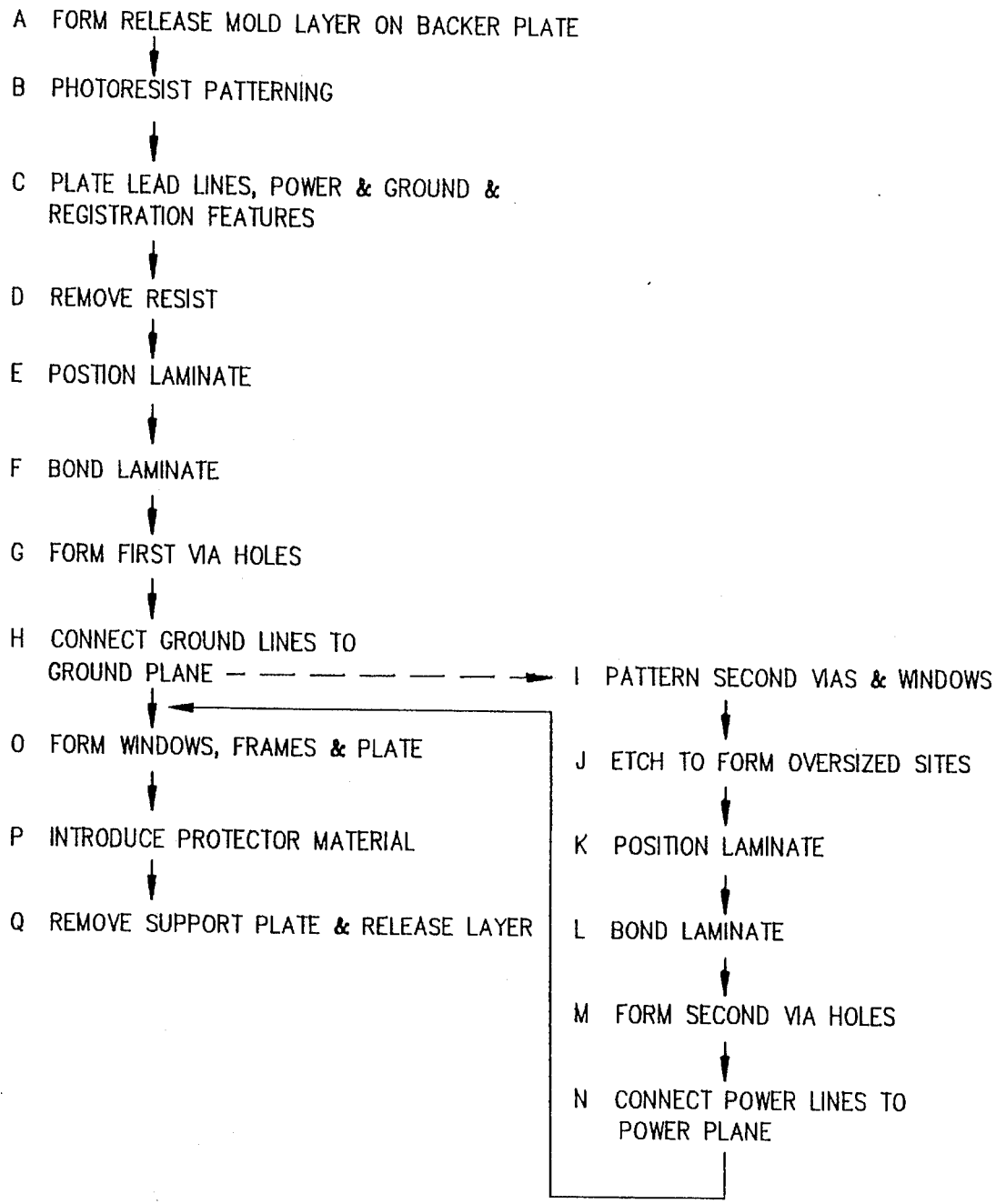

AREA ARRAY INTERCONNECT DEVICE AND METHOD OF MANUFACTURE THEREOF

RELATION TO OTHER APPLICATIONS

This is a continuation of application Ser. No. 07/767,228 filed on Sep. 27, 1991, now abandoned, which is a continuation-in-part of U.S. application Ser. No. 601,927, field Oct. 23, 1990 and now U.S. Pat. No. 5,053,921 issued Oct. 1, 1991, which is a continuation-in-part of 352,112, filed Sep. 15, 1989, now U.S. Pat. No. 4,995,941.

BACKGROUND OF THE INVENTION

In recent years there has been an increased requirement for high lead count interconnect devices, especially for high density electrical components such as integrated circuits, multichip modules, etc. In recent years the packaging of integrated circuits (ICs) has evolved from conventional devices such as the dual in-line package (DIP) to a variety of devices such as surface mounted packages. This evolution has led to the need for further advanced interconnect devices to connect the ICs to other circuitry. Various approaches have been proposed and used to effect such interconnection, such as wire bonding and tape automated bonding (TAB) products.

As this field of technology has developed, the requirements for the number of leads to connect the IC to external circuitry has increased. That is, there is a growing requirement for interconnect devices that are sometimes referred to as high lead count devices. There is a need in the art for high lead count in the range of 300 or more. As the lead count increases, the requirements for the interconnect device become more difficult. The problems are further compounded or complicated by requirements for increased switching speed and increased switching current, all of which combine with high lead count to cause serious noise problems and create or present the need for extremely low inductance decoupling.

Prior application Ser. No. 352,112, filed May 15, 1989 (now U.S. Pat. No. 4,995,941, the entire disclosure of which is incorporated herein by reference) and assigned to the assignee hereof, disclosed apparatus and a method for an interconnect device having fine lead widths, fine lead spacing, close control of input/output (I/O) line width and also incorporating a voltage (power or ground) plane with via interconnects between the voltage plane and selected I/O leads. Copending application Ser. No. 601,927 filed Oct. 23, 1990 for Multilayer Interconnect Device and Method of Manufacture Thereof, now U.S. Pat. No. 5,053,921, and assigned to the assignee hereof, expands on the subject matter of U.S. Ser. No. 352,112 to achieve an interconnect device having both power and ground planes connected by vias to selected I/O leads.

As the requirements grow for high lead count interconnect devices, the factors of size of the interconnect device and lead spacing and low inductance decoupling become more critical. This is particularly true where, as was the case in the prior art, a large percentage (typically up to 30%) of the I/O leads of a TAB interconnect device are devoted to ground and power supply to the IC. That means, of course, that for each I/O lead dedicated to power or ground, there is one less lead available for I/O signal transmission. The result is that if size is the controlling factor, one must settle for an interconnect device whose I/O signal lead capacity is reduced by the number of leads that must be dedicated to ground and power supply. Conversely, if signal carrying capacity is the controlling factor, one must use an interconnect device of a size large enough to accommodate all of the signal I/O lines and all of the I/O lines dedicated to ground and power supply. This often results in the need to increase the size (and the manufacturing cost) of the IC die (because of the need to increase the number of I/O pads on the die) and also results in using up valuable "real estate" on the circuit board of which the IC is a part.

In addition to the above, many high lead count ICs have requirements for interconnect devices with impedance control to reduce mismatched impedance of signal lines. Also, with fine pitch of leads, signal crosstalk may become a problem. Similarly, there are requirements for high lead count interconnection devices for other electronic components, such as high density multichip modules, to interconnect the electronic components to other circuit components such as a printed circuit board. Such high lead count interconnect devices may have problems and requirements similar to those discussed above.

SUMMARY OF THE INVENTION

The present invention addresses the problems discussed above in a new and improved interconnect device and method of manufacture thereof. The present invention will be described primarily in the context of an interconnect device for an IC sometimes referred to in the art as a high lead count tape automated bonding (TAB) interconnect circuit; and the present invention is applicable both to conventional "face-up" TAB and also to "flip" TAB; but it will be understood that the present invention is not limited to TAB devices. While the present invention is particularly suitable for and intended to be a high lead count interconnect device (e.g., in the range of 300 or more leads), and will be described in that context, it should also be understood that the features and advantages of both the process and the end product of the present invention can also be employed in similar interconnect devices that do not have high lead count requirements and in other advanced interconnect applications such as connections from multichip modules to circuit boards.

Most importantly, with the interconnect device of the present invention, ground and/or power is supplied to the IC device at locations inboard of the outer edges of the die (whereas all I/O routing, including power and ground, in prior art devices has typically gone to the outer edges of the die). This is accomplished by populating the normally open, i.e., center window, area of the TAB device with groups of discrete ground and/or power leads which are connected by vias to ground and/or power planes, respectively. The ground and/or power planes are each connected, respectively, to sources of ground and/or power voltages, which are preferably sources other than the peripheral I/O leads, and all of the peripheral I/O leads are thus free to be used to carry signals.

A prior art technology known as "flip chip" does allow one to make connections to the interior of the die. However, with this technology, it is very difficult and expensive to functionally pretest the die; and this testing difficulty is the major reason why this "flip chip" technology has not been widely adopted.

An important result of this construction is that for a given requirement for I/O signal lines, a smaller interconnect device can be used and a smaller (and hence less expensive)

IC die can be used; or, conversely, one can increase the number of I/O leads available for signal use for a given size of interconnect device and die. Another option that becomes available with the present invention is to keep the die and TAB interconnect and the number of I/O leads constant, but increase the lead pitch (i.e., increase the interlead spacing), thereby reducing alignment and bonding problems between I/O leads and the die. Bearing in mind that it is not unusual in the prior art for up to 30% of the I/O lines to be used for ground and/or power, it can be seen that the savings in interconnect device and die size, or the increase in signal capacity, or the improvement in alignment capability achievable with the present invention is significant. This also makes possible greater flexibility in design of I/O routing and greater design flexibility of the IC die itself since ground and power can be delivered to the central part of the die rather than just to the periphery.

Another important feature and advantage of the present invention is that the construction of the IC die, per se, can be simplified (and, hence, reduced in cost) by elimination of the ground and/or power planes usually found in the die and by using ground and/or power planes in the interconnect device to distribute ground and/or power to pads on the central part of the die.

The present invention also contributes to reduced switching noise because of the low inductance and moderate capacitance resulting from the presence of the ground and power planes and short (length), direct connection paths from those planes to pads on the IC die.

The present invention can also be incorporated in flip TAB systems (in addition to conventional "face-up" TAB systems), thereby resulting in an even smaller "footprint" and increased overall packaging density than is achievable with flip TAB in general In one modified embodiment of the present invention, a decoupling capacitor can be electrically connected between the ground and power planes to incorporate high capacitance with a minimum of added inductance, thus further reducing switching noise.

The above described and other features and advantages of the present invention will be understood by those skilled in the art from the following detailed description and drawings:

BRIEF DESCRIPTION OF THE DRAWINGS

Referring to the drawings, wherein like elements are numbered alike in the several FIGURES:

FIG. 3A is an enlarged view of the area within the broken oval line indicated in FIG. 3, the oval line being only for the purpose of identifying the enlarged area shown in FIG. 3A.

FIGS. 4A, 4B and 4C are views similar to FIG. 4 showing alternative embodiments.

FIGS. 5A and 5B show the structure of FIG. 5 used to effect power and ground connections for the device of the present invention.

FIGS. 12 through 27 depict various partial sectional elevation views as if taken along line 4-4 of FIG. 3 showing the device at various stages of manufacture.

FIG. 28 is a block diagram of the manufacturing process of the present invention.

DESCRIPTION OF THE PREFERRED EMBODIMENT

Figure 1:
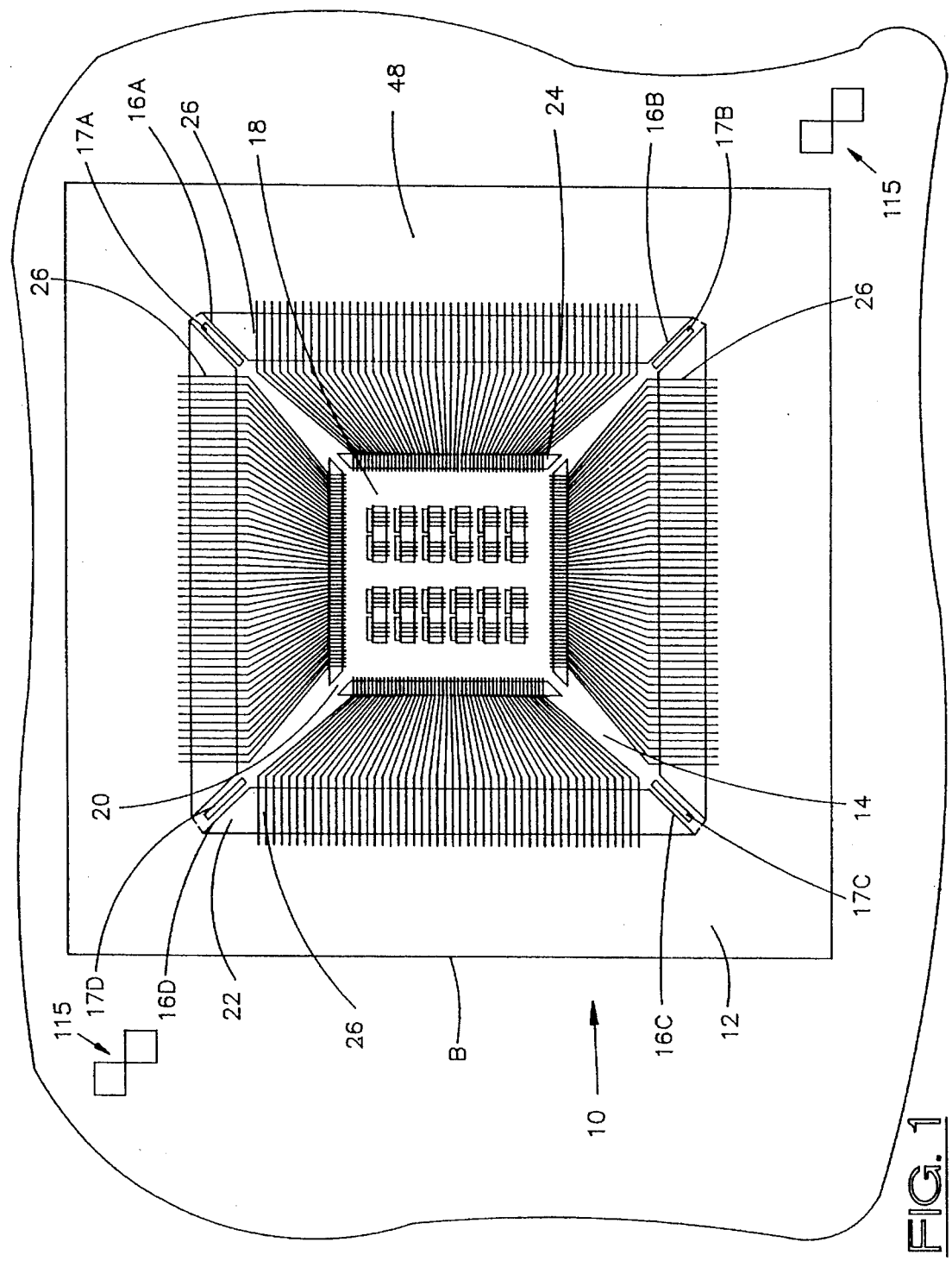
FIG. 1 is a plan view of a "face-up" area array interconnect device of the present invention (shown from the bottom in the manufacturing process where it constitutes one of a number of devices made in sheet form).

Referring to a combined consideration of FIGS. 1–4, the "face-up" TAB interconnect device 10 of the present invention has an outer frame structure 12 connected to an inner frame structure 14 by corner tabs 16. Inner frame 14 is, in turn, connected to a central body portion 18 by tabs 20. An outer window 22 is located between outer frame 12 and inner frame 14, the tabs 16 spanning window 22 at the four corners as shown to divide the window into four segments. Similarly, an inner window 24 is located between inner frame 14 and central body 18, the tabs 20 spanning window 24 at the four corners as shown to divide the window into four segments. The uneven line around the TAB device 10 depicts that FIG. 1 shows the TAB device 10 as one of a number made in sheet form in the manufacturing process. The peripheral boundary of an individual device 10 is indicated at B.

The presence of inner body 18 is an important difference over conventional TAB devices, which are open (i.e., have a central window), where central body 18 is present in this invention.

Four groups of I/O signal lead lines 26 extend from each side of outer frame 12 to inner body 18, terminating near the outer periphery of inner body 18. The leads 26 in each group usually extend straight across window 22 (i.e., they are perpendicular to the outer and inner edges of window 22), then converge toward inner window 24 and then usually extend straight across window 24 (i.e., they are perpendicular to the outer and inner edges of window 24). The lines 26 serve to carry signals to and from IC dies positioned within the area of inner body 18.

Figure 2:
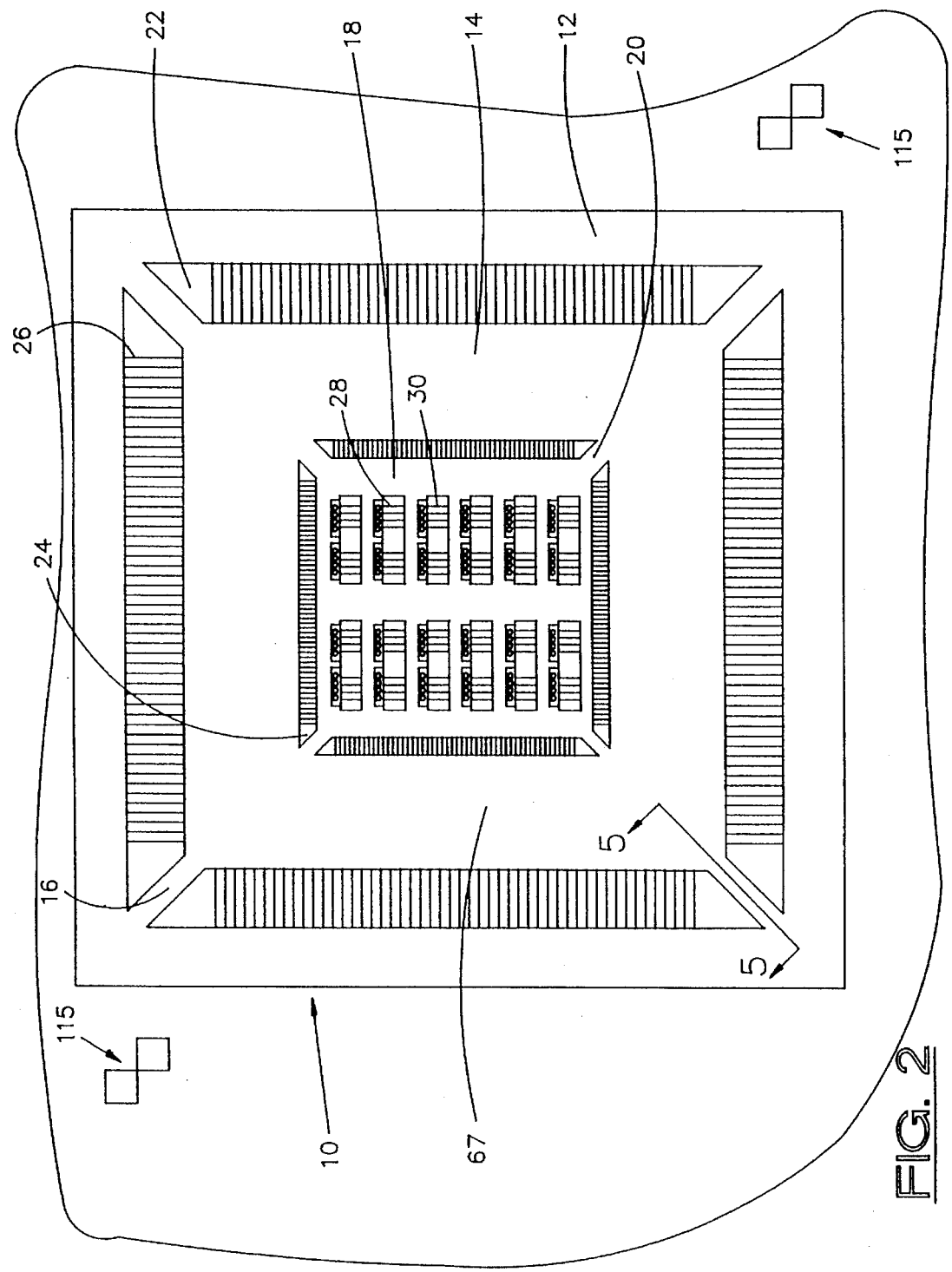
FIG. 2 is a plan view of the device of FIG. 1 rotated 180° to reverse the top and bottom surfaces.
Figure 3:
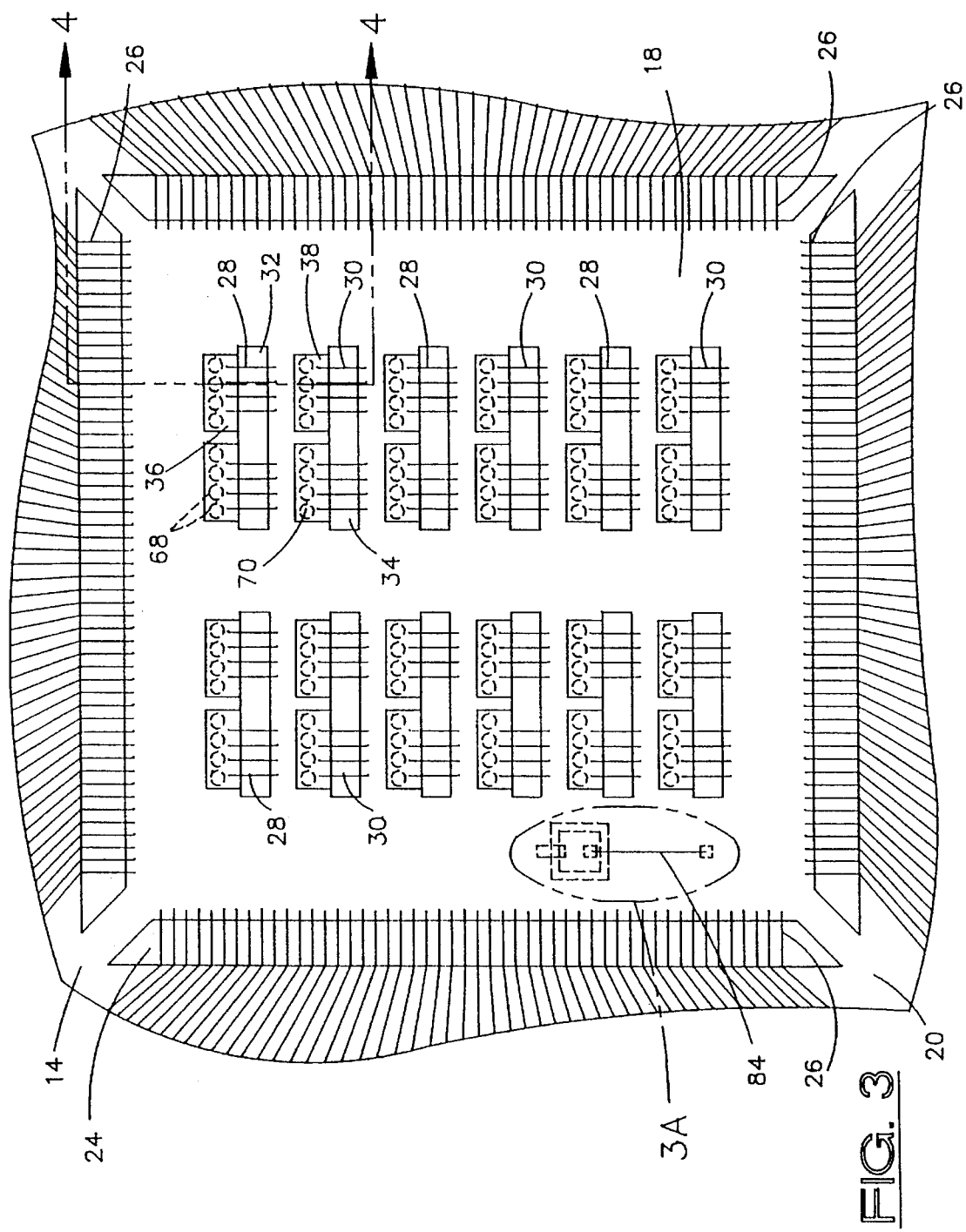
FIG. 3 is an enlarged detail view of the central portion of FIG. 1.

Referring particularly to FIGS. 2 and 3, within central body 18 there are located groups of ground leads 28 and power leads 30 (sometimes referred to herein as "area array leads"). Leads 28 and 30 serve to supply ground and power voltages, respectively, to one or more IC dies within the area of inner body 18. Multiple groups of leads 28 and 30 are shown in FIGS. 2 and 3. The ensuing description will refer to one group of each of leads 28 and 30, and it will be understood that the description applies to all such groups. The signal leads 26 and the ground and power leads 28 and 30 are all located in the same layer or plane of the interconnect device. The leads 28 and 30 span windows 32 and 34, respectively in inner body portion 18. One end of each of the leads 28 merges into a bus 36, and one end of each of the leads 30 merges into a bus 38. The groups of ground leads 28 and power leads 30 can be arranged alternately as shown in FIG. 3, or they can be arranged in any other array, either regular or irregular, to suit the requirements of the situation in which the interconnect device is to be employed. Also, while the regular array of windows 32, 34 and leads 28, 30 shown in FIGS. 1–3 illustrates the invention, it will be understood that in actual practice those windows and groups of area array leads may be arranged regularly or irregularly depending on the requirements of any given situation.

While the foregoing description has described groups of ground and power leads 28 and 30, respectively, for delivering ground and power to the IC die, it will also be understood that with the present invention power or ground can be delivered to the die at any desired location or locations on the die within the area of central body 18 by either a single lead or groups of leads.

Figure 4:
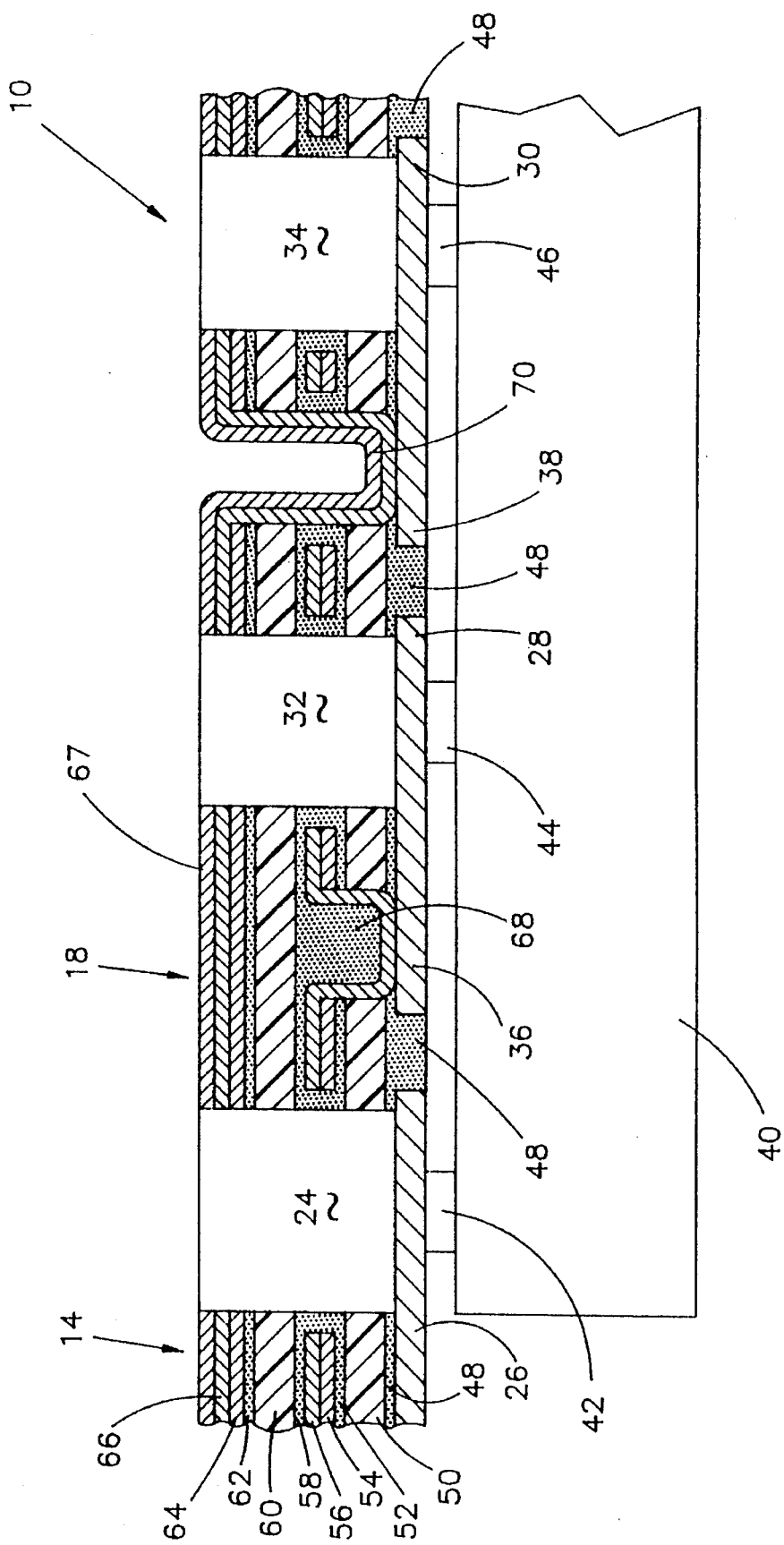
FIG. 4 is a partial sectional elevation view taken along line 4—4 of FIG. 3 and showing the TAB device mounted on an IC die.

Referring particularly to FIG. 4, the interconnect device 10 is shown mounted on top of a silicon die (I/C) 40. Die 40 has a peripheral array of die bond pads 42 which are connected to circuitry internal of the die 40 and to which the I/O signal leads 26 are bonded (that peripheral arrangement being the conventional configuration for the location of I/O die bond pads). Although only one peripheral die bond pad 42 is shown, it will be understood that the die bond pads 42 extend in a generally rectangular peripheral array around the outside edge of die 40 to receive and be bonded to each of the I/O leads 26 of interconnect device 10.

While the conventional I/C configuration has I/O die bond pads on the periphery of the die (as described above) it will also be apparent that with the present invention I/O leads 26 could, if desired, be brought into contact with I/O die bond pads located at sites on the die inboard of the usual peripheral location by forming leads 26 of appropriate length.

Die 40 also has a plurality of ground die bond pads 44 and a plurality of power die bond pads 46 located on the face of the die internally or inboard of the peripheral pads 42. The pads 44 and 46 are also connected to circuitry internal of the die 40 to distribute ground and power voltage to the IC. Although only one each of the ground and power pads 44 and 46 is shown in FIG. 4, it will be understood that there is an array of each of such pads 44 and 46 on the face of the die, one each corresponding, respectively, to each of the ground and power leads 28, 30. The pads 44 and 46 are located so as to be bonded to the leads 28, 30 at the ends thereof removed from the busses 36, 38.

Figure 5:
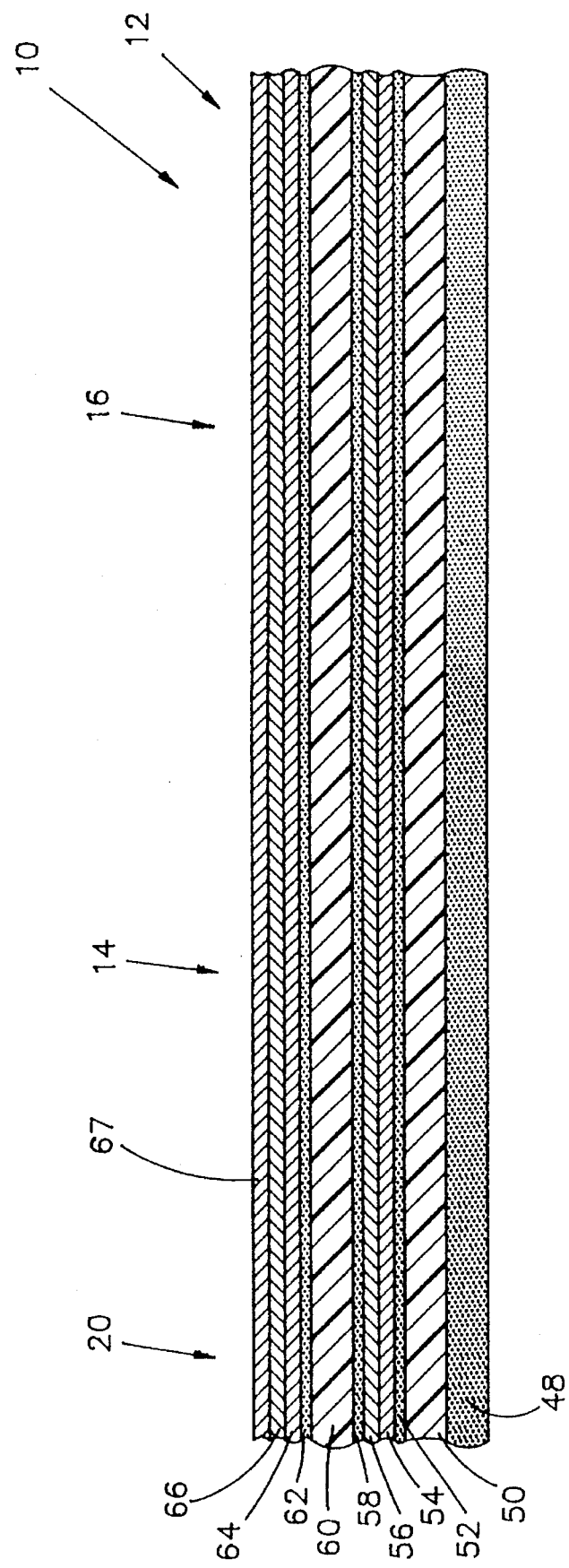
FIG. 5 is a view along line 5–5 of FIG. 2.

Still referring particularly to FIG. 4 and also to FIGS. 2, 3 and 5, it can be seen that inner frame 14 and central body 18 have a multilayer construction. Frame 14, the construction of which carries through to outer frame 12 and the connecting tabs 16 and 20, has a layer of adhesive 48 which bonds a dielectric layer (such as polyimide) 50 to the I/O leads 26. Another layer of adhesive 52, in turn, bonds a layer of copper 54 to dielectric layer 50. The dielectric 50, adhesive 52 and copper 54 are, preferably, a pre-existing laminate. Another layer of copper 56 is electrocoated over copper layer 54, and the electroplated layer 54 is, in turn, bonded by a layer of adhesive 58 to a preformed laminate consisting of a layer of dielectric (e.g., polyimide) 60, a layer of adhesive 62 and a layer of copper 64. Another layer of copper 66 is electrocoated over copper layer 64 and a final layer of gold 67 may be plated over copper layer 66.

The inner and outer frames 12 and 14, the connecting tabs 16 and 20 and the central body 18 are a continuous structure having the same general multilayer construction described immediately above interrupted by the presence of the windows 22, 24, 32 and 34. In addition, the central body 18 includes in its multilayer construction first and second sets of multiple vias 68 and 70.

Vias 68 are formed as a part of electroplated copper layer 56 through copper layer 54, adhesive 52, dielectric 50 and adhesive 48 down to the bus 36, and the electroplated copper layer 56 extends into the via down to the bus 36 to connect the copper layer 54, 56 to the ground leads 28. The copper layers 54, 56 constitute a ground plane, and it will be understood that a plurality of the vias 68 extend from the ground plane to each of the busses 36 associated with the ground leads 28. Multiple vias 68 are provided from the ground plane to each buss 36 for redundancy and to increase current carrying capacity.

Vias 70 are formed as part of electroplated copper layer 66 through copper layer 64, adhesive 62, dielectric 60, adhesive 58, copper 56, copper 54, adhesive 52, dielectric 50 and adhesive 48 down to bus 38, and the electroplated copper layer 66 extends into the via down to the buss 38 to connect the copper layer 64, 66 to the power leads 30. The copper layers 64, 66 constitute a power plane, and it will be understood that a plurality of the vias 70 extend from the power plane to each of the busses 38 associated with the power leads 30. Multiple vias 70 are provided from the power plane to each buss 38 for redundancy and to increase current carrying capacity.

Figure 3B:
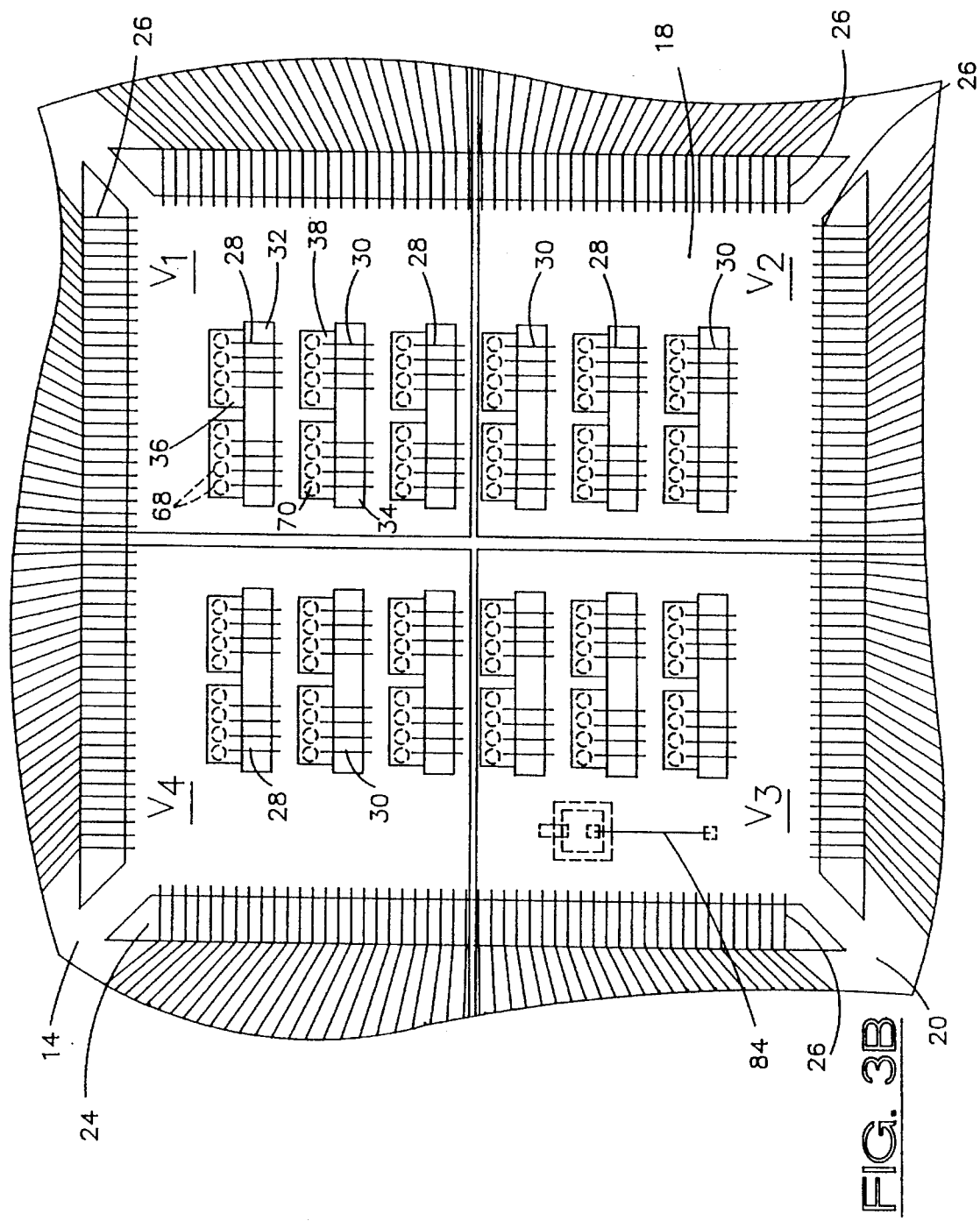
FIG. 3B is a view similar to FIG. 3 showing segmented ground and/or power planes.

If desired, the power plane could be formed in two or more electrically isolated separate segments, and different power levels could be delivered to the separate segments through separate tabs 16A–16D (see FIG. 1). Similarly the ground plane can be split into electrically isolated segments to provide different reference voltage levels for pairing with different power levels. For example, FIG. 3B shows power plane 64, 66 segmented into four electrically isolated segments so that four different power levels, $V_1, V_2, V_3, V_4$, can be supplied to one or more IC dies. One common ground plane, or multiple ground planes can be associated with the several power planes. The segmenting of the power voltage plane and/or the ground plane makes it possible to pair power and ground levels and isolate any particularly noisy power level from the rest of the unit. For example, if the four power levels $V_1$–$V_4$ are paired with four reference (ground) levels $G_1$–$G_4$, and if one of the power levels, (e.g., $V_1$) is particularly noisy, the noisy voltage level (e.g., $V_1$-$G_1$) can be isolated from the rest of the voltage supplies. Although the segmenting of voltage planes has been shown in quadrants, it will also be understood that either a ground or power plane could be further segmented within a quadrant; and any segmenting could be in any desired pattern other than quadrants.

The windows 22, 24, 32 and 34 pass through the layers of the interconnect device down to the I/O leads 26 and to the ground and power leads 28, 30 as shown in FIG. 4. It will be noted, for reasons to be explained more fully in connection with the construction of the interconnect device, that copper layers 54 and 56 are cut back or recessed around the windows 24, 32 and 34.

Figure 6:
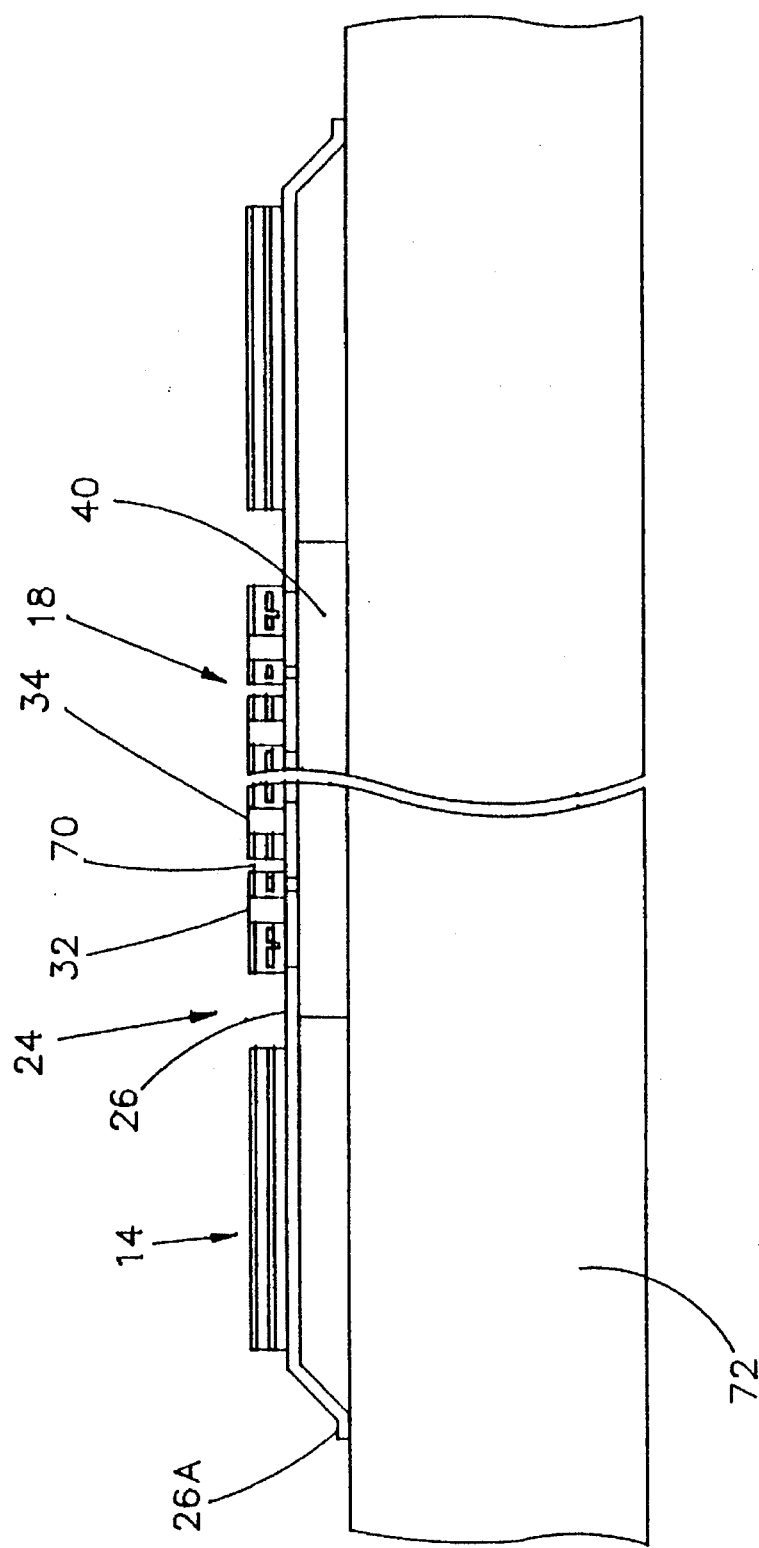
FIG. 6 is a schematic showing the area array interconnect device of the present invention in the form of a conventional TAB interconnect device mounted for use on a circuit board.

In the operation of the interconnect device, the outer ends of the leads 26 are severed at some intermediate point in the span of window 22, and the severed ends 26(A) of the I/O leads 26 are connected to circuitry on a circuit board 72 to deliver signals to or from the I/C 40 (see FIG. 6). The windows 24, 32 and 34 provide access for a bonding tool to bond the leads 26, 28 and 30 to their respective die bond pads 42, 44 and 46. Ground is supplied from a tab 16A to ground plane 54, 56, and the ground is delivered to the I/C by vias 68, busses 36 and ground leads 28. Power is supplied from a tab 16B to power plane 64, 66, and the power is delivered to the I/C by vias 70, busses 38 and power leads 30.

When the leads 26 are severed, the tabs 16 are also severed (as indicated by the dashed lines in FIG. 1), and one or more of the tabs 16A is used to supply ground to the ground plane and one or more of the tabs 16B is used to supply power voltage to the power plane.

As shown in FIG. 5, power plane 64, 66 extends across tabs 16 and 20 and is readily accessible so that a source of power can easily be connected directly to the power plane layer in tab 16B to deliver power to the power plane. Similarly, ground can be supplied by connecting a ground source to ground plane 56, 58.

FIG. 6 shows, schematically, a TAB device of the present invention mounted on a circuit board 72, with outer ends 26A of the I/O leads connected to circuit traces on the circuit board.

Referring to FIG. 5A, ground may be supplied from circuit board 72 to ground plane 54, 56 through tab 16A. Tab 16A has a metal contact strip 17A (formed thereon at the same time I/O leads 26 are formed), and tab 16A is bent in a "Z" shape to establish contact between strip 17A and a ground line (not shown) on circuit board 72. A via 68A extends from ground plane 54, 56 to contact the strip 17A/ground line on the circuit board, whereby all of ground plane 54, 56 in the device is at ground level. If the ground plane is to be segmented, two or more vias 68A will connect separate segments of the ground plane to separate ground lines on circuit board 72 at, e.g., tabs/contact strips 16A/17 and/or 16C/17C. Similarly, as shown in FIG. 5B, power may be supplied from circuit board 72 to power plane 64, 66 through tab 16B. Tab 16B has a metal contact strip 17B (formed thereon at the same time I/O leads 26 are formed), and tab 16B is bent in a "Z" shape to establish contact between strip 17B and a power line (not shown) on circuit board 72. A via 70A extends from power plane 64, 66 to contact the strip 17B/power line on the circuit board, whereby all, or a segment, of power plane 64, 66 is at the power level. If the power plane is to be segmented, the several segments will each be connected to different power lines on circuit board 72 by separate vias in several of the tabs 16 from the power plane segments to the power lines on the circuit board such as, e.g., tabs/contact strips 16B/17B, 16D/17D. It will be understood that any combination of tabs/contact strips can be connected by vias 68A and/or 70A to any desired ground or power segment(s).

Figure 7:
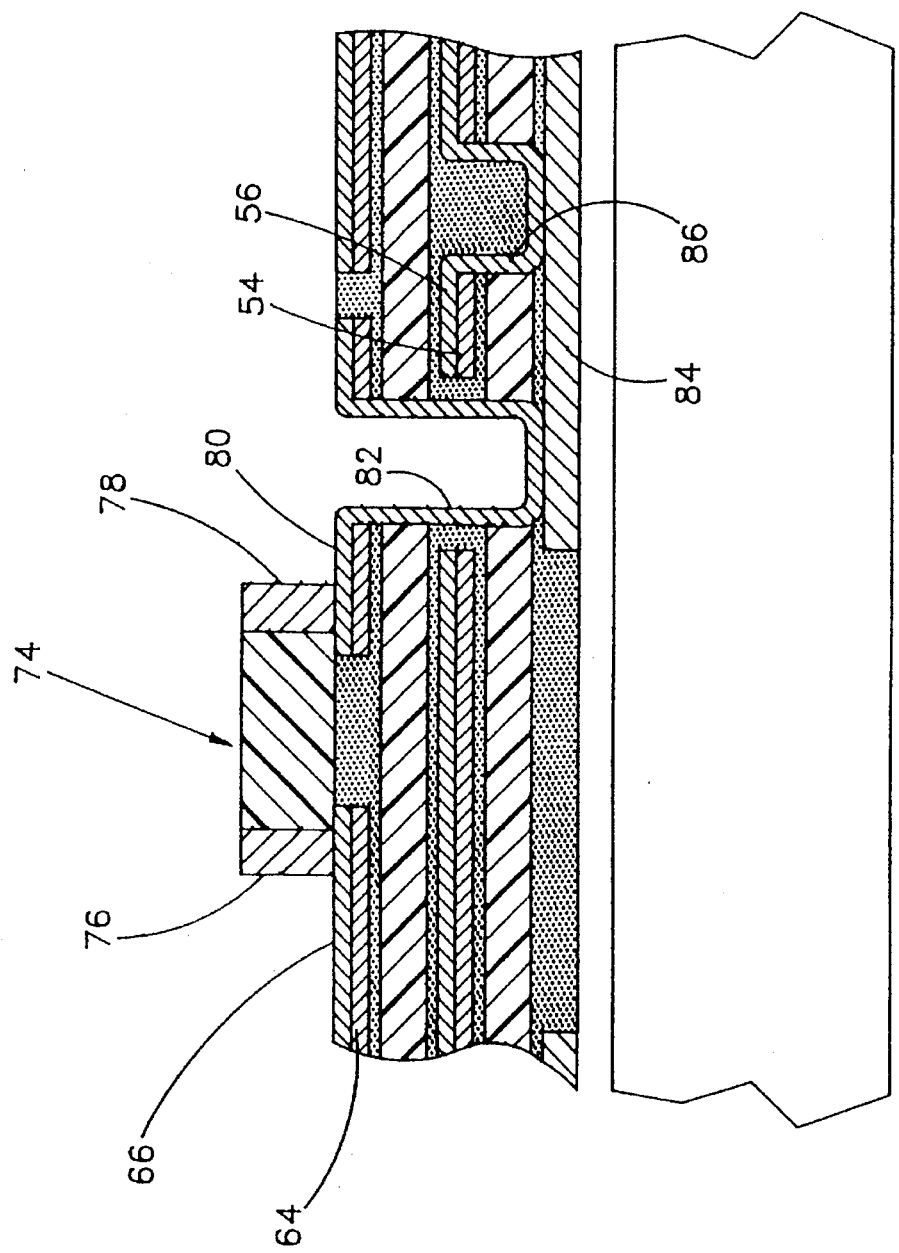
FIG. 7 is a partial sectional view taken along line 7—7 of FIG. 3A showing the interconnect device modified to incorporate a decoupling capacitor.

Referring to FIGS. 7 and 3A, the area array interconnect device of FIGS. 1–6 is shown with the addition of a decoupling capacitor 74 which is connected between the power and ground planes. One plate 76 of capacitor 74 is directly connected to power plane 64, 66. The other plate 78 of the capacitor is connected to an electrically isolated segment 80 of the power plane. That is, segment 80 is originally formed as part of the power plane 64, 66. The other plate 78 of the capacitor is connected to an electrically isolated segment 80 of the power plane. That is, segment 80 is originally formed as part of the power plane 64, 66, but it is subsequently electrically isolated from the power plane by photoresist masking and etching completely around segment 80 so that segment 80 is electrically isolated from the power plane although it remains physically at the level of the power plane. Segment 80 is connected by a via 82 to a decoupling capacitor lead 84 in the signal plane, and lead 84 is also connected to ground plane 54, 56 by a via 86. Thus, capacitor plate 78 is connected to the ground plane 54, 56 so that the capacitor is connected across the power and ground planes for decoupling purposes. Lead 84 is shown in FIG. 3 as being separate from the arrays of ground and power leads 28 and 30. Alternatively, lead 84 and via 86 could be omitted, and via 82 could connect island 80 and capacitor plate 78 directly to ground plane 54, 56. However the first method of interconnection using lead 84 and via 86 are preferred because it is easy to make lead 84, and vias 82 and 86 as shown in FIG. 7 in the course of the manufacturing process to be described hereinafter. The incorporation of decoupling capacitor 74 decouples both the ground and power planes and the die, because the ground and power planes are connected to the die.

The device shown and described in FIGS. 1–5 has separate ground (54/56) power planes 64/66, respectively, and it also has both area array ground (28) and power (30) lines connected, respectively, to the ground and power planes. As one alternative embodiment of the present invention, one of the voltage planes (i.e., either the ground plane 54/56 or the power plane 64/66) could be omitted to form a two layer device generally such as in U.S. Ser. No. 352,112, now U.S. Pat. No. 4,995,941. In that event, the area array leads (i.e., 28/30) of this invention would all be connected by vias to the one voltage plane, either ground or power, that was present so as to delivery either ground or power voltage to the interior of the IC die in accordance with the present invention. That alternative arrangement is shown in FIG. 4A, where a single voltage plane 54'/56' (which could be either a ground or power plane) is connected by vias 68' to area array busses/leads 36/38 and 38/30.

Figure 4B:
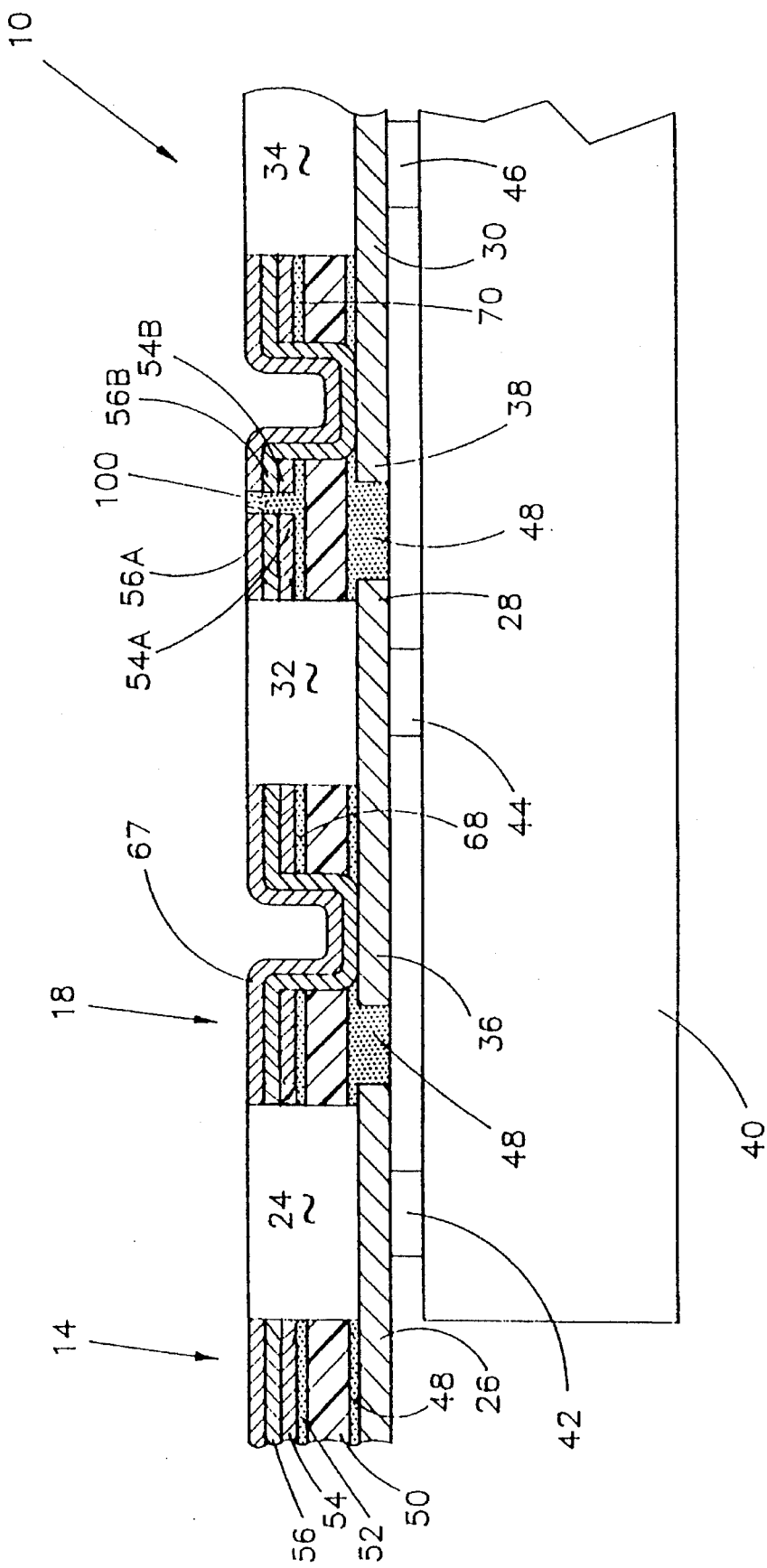

In a second alternative embodiment (see FIG. 4B), one of the voltage planes, e.g., plane 64/66 omitted, and the remaining voltage plane is segmented into at least two segments 56A, 58A and 56B, 58B by a segmenting strip 100 which electrically isolates the two segments. Segment 54A, 56A is connected (as per the structure of FIG. 5A) to ground on a circuit board and to busses/leads 36/28 by vias 68 to supply ground to busses/leads 36/28. Similarly, segment 56B/58B is connected (as per the structure of FIG. 5A) to power on a circuit board and to busses/leads 38/30 by vias 68" to supply power to busses/leads 38/30.

Figure 4C:
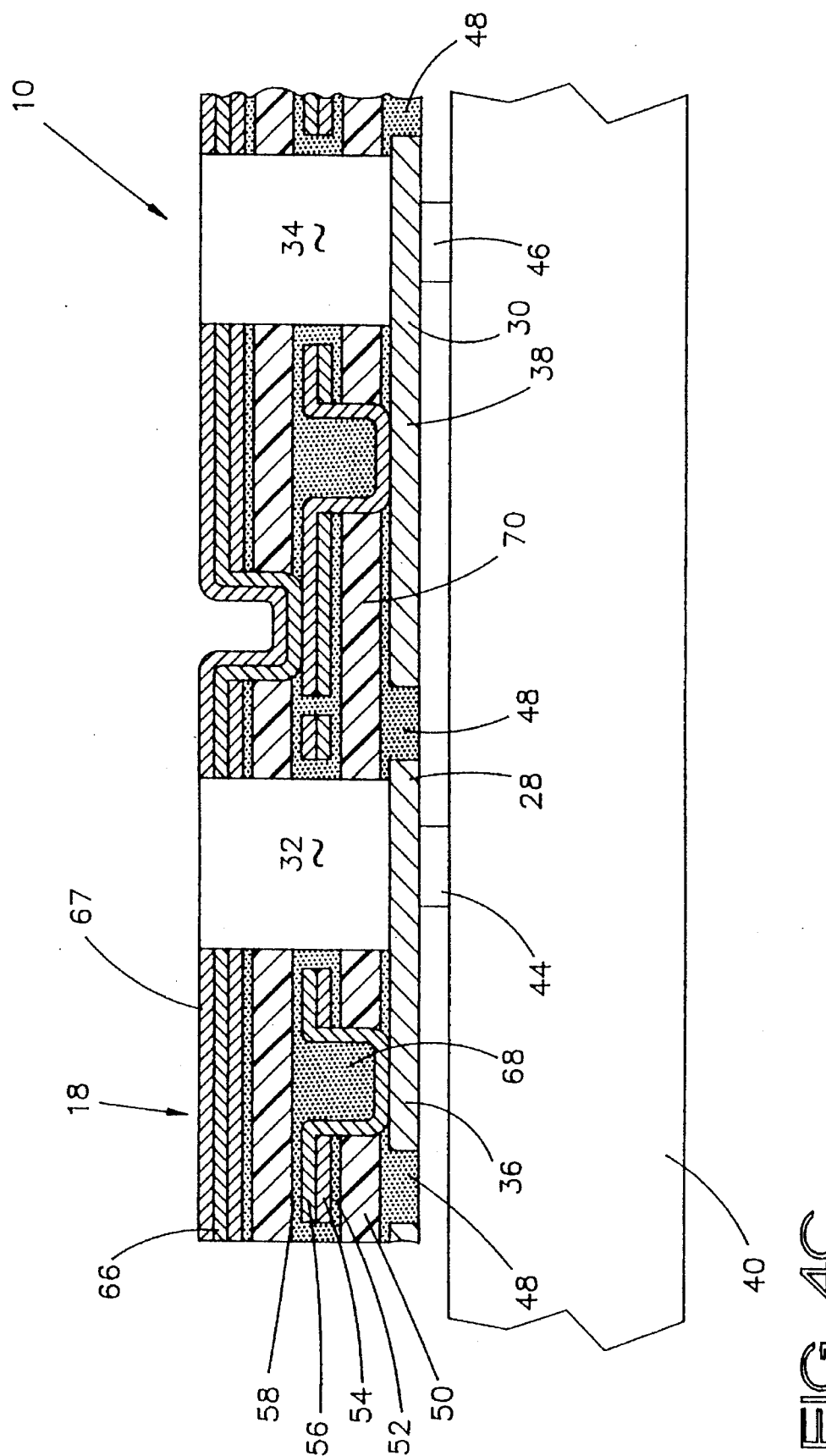

While the interconnect device of the present invention has been described in terms of direct connections from the uppermost voltage planes (i.e., power plane 64/66) to the area array busses/leads 38/30 by connecting vias 70, the aspect ratio of such a connecting via may be undesireably high. Therefore, as an alternative (see FIG. 4C), each connecting vias 70 may be formed in two steps or via segments 70A and 70B. Via segment 70A extends from the physical level of layers 54/56 to busses/lines 38/30, and via segment 70A is connected to a landing pad 102 which is electrically isolated from layers 54/56. Via segment 70B extends from power plane 64/66 to landing pad 102. Thus, the connection is from power plane 64/66 by via segment 70B to landing pad 102, and then by via segment 70A from landing pad 102 to buss/lines 38/30. In this embodiment, via segment 70A would be formed at the same time in the manufacturing process as the formation of vias 68; landing pad 102 would be formed at the same time as the formation of boundary B'; and via segments 70A would be formed to extend only to landing pads 102 rather than all the way to busses/lines 38/30.

Figure 8:
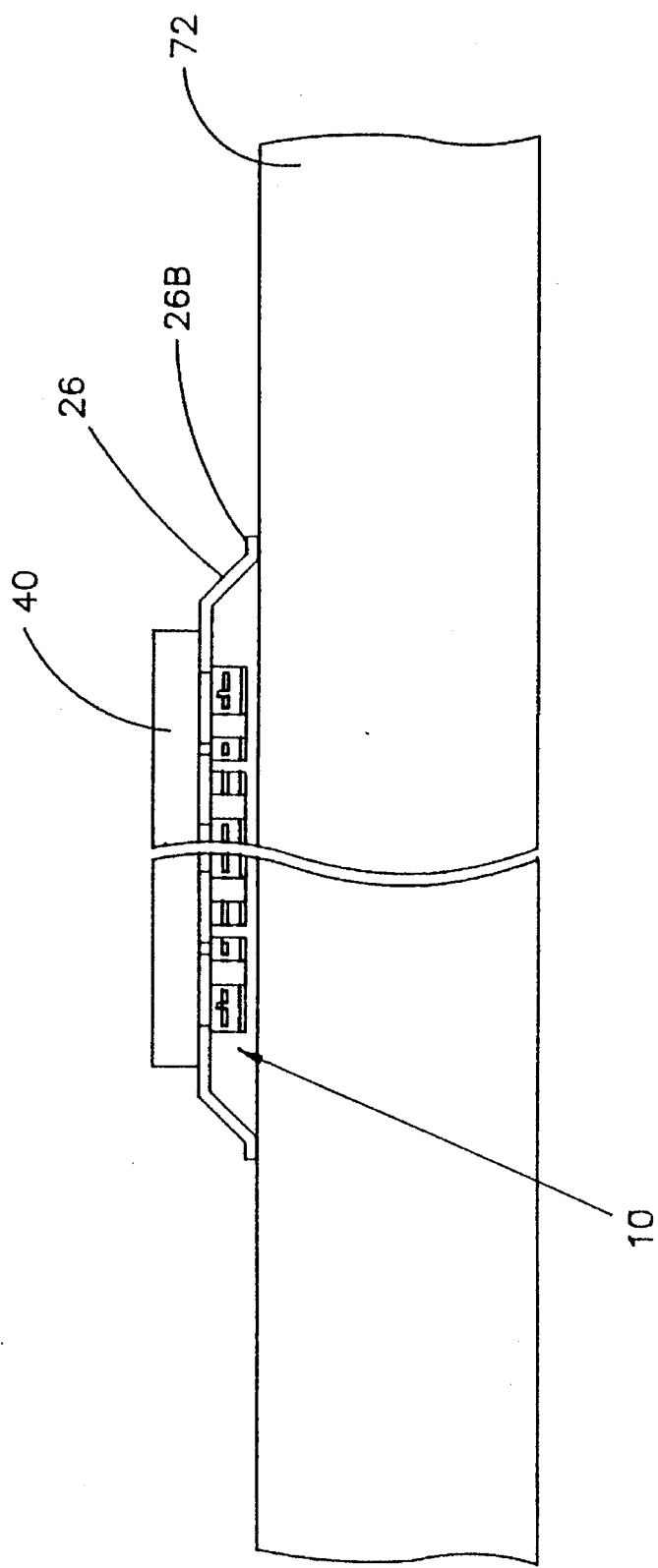
FIG. 8 is a schematic view similar to FIG. 6 showing the area array interconnect device of the present invention in the form of a flip TAB interconnect device for use on a circuit board.
Figure 9:
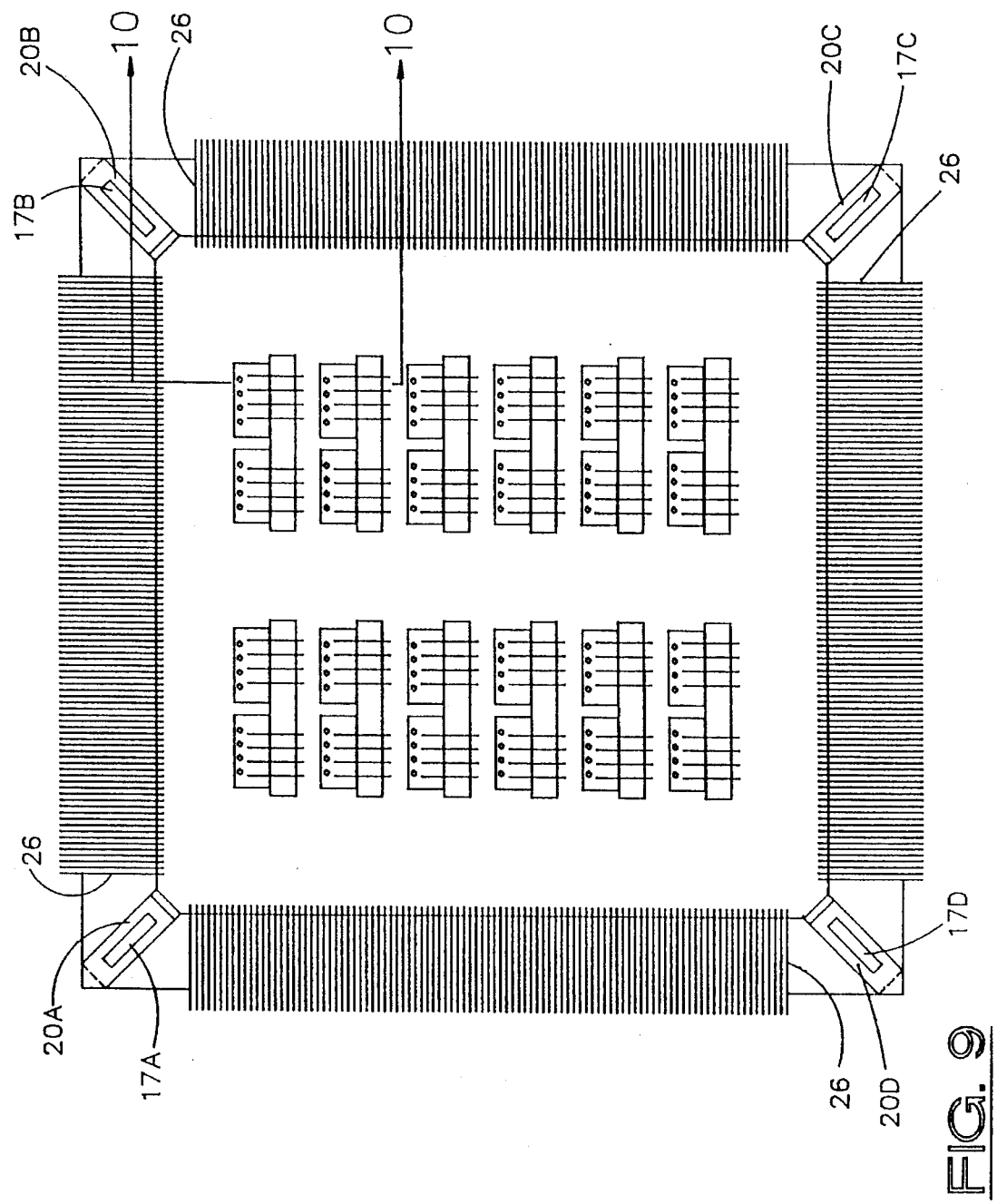
FIG. 9 is a plan view of an area array flip TAB interconnect device according to the present invention as it would be installed or ready to be installed for use.
Figure 10:
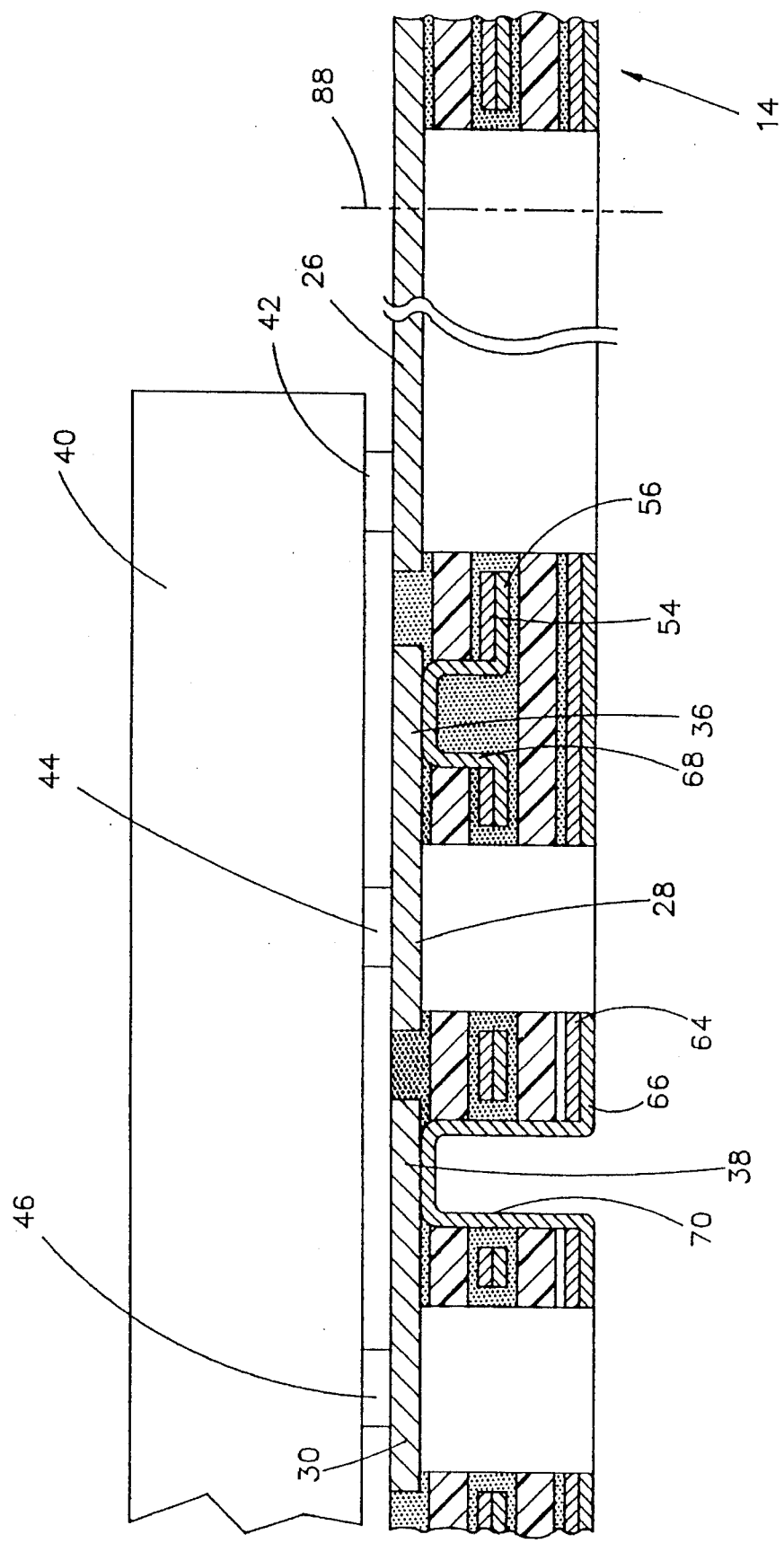
FIG. 10 is a partial sectional elevation view taken along line 10—10 of FIG. 9 and showing the TAB device mounted with an IC die prior to outer lead bonding to a circuit board.

FIGS. 8–10 show the present invention in the embodiment of a so-called flip TAB arrangement where the die 40 is positioned on top of the TAB interconnect device, with the leads 26 being connected at 26B to circuit traces on circuit board 72.

The area array flip TAB device is made by the same process as the area tab discussed above. However in actual use of the area array flip TAB device of FIGS. 8–10, the leads 26 are severed just inboard of the inner edge of frame 14 (at the dashed vertical line 88 of FIG. 10), and the area array flip TAB device is mounted between a circuit board 72 and an IC 40 as shown in FIG. 8. The severed ends 26B of the I/O leads 26 are connected to circuitry on the circuit board to deliver signals to or from the IC 40. As shown in FIG. 10, as with the first embodiment, the inboard ends of the leads 26 are bonded to a peripheral array of die bond pads 42, the ground plane 54, 56 is connected at via 68 to bus 36 and ground lead 28 which, in turn, is connected to die bond pad 44, and the power plane 64, 66 is connected at via 70 to bus 38 and power lead 30, which, in turn, is connected to die bond pad 46.

When the leads 26 are severed, the frame tabs 20 are also severed as shown in FIG. 9, and one or more of the tabs 20A is used to supply ground voltage and one or more of the tabs 20B is used to supply power voltage to the power plane in the same way as described above for tabs 16A and 16B. In this embodiment, the connecting strips 17A–17D are located on tabs 20A–20D.

Figure 11:
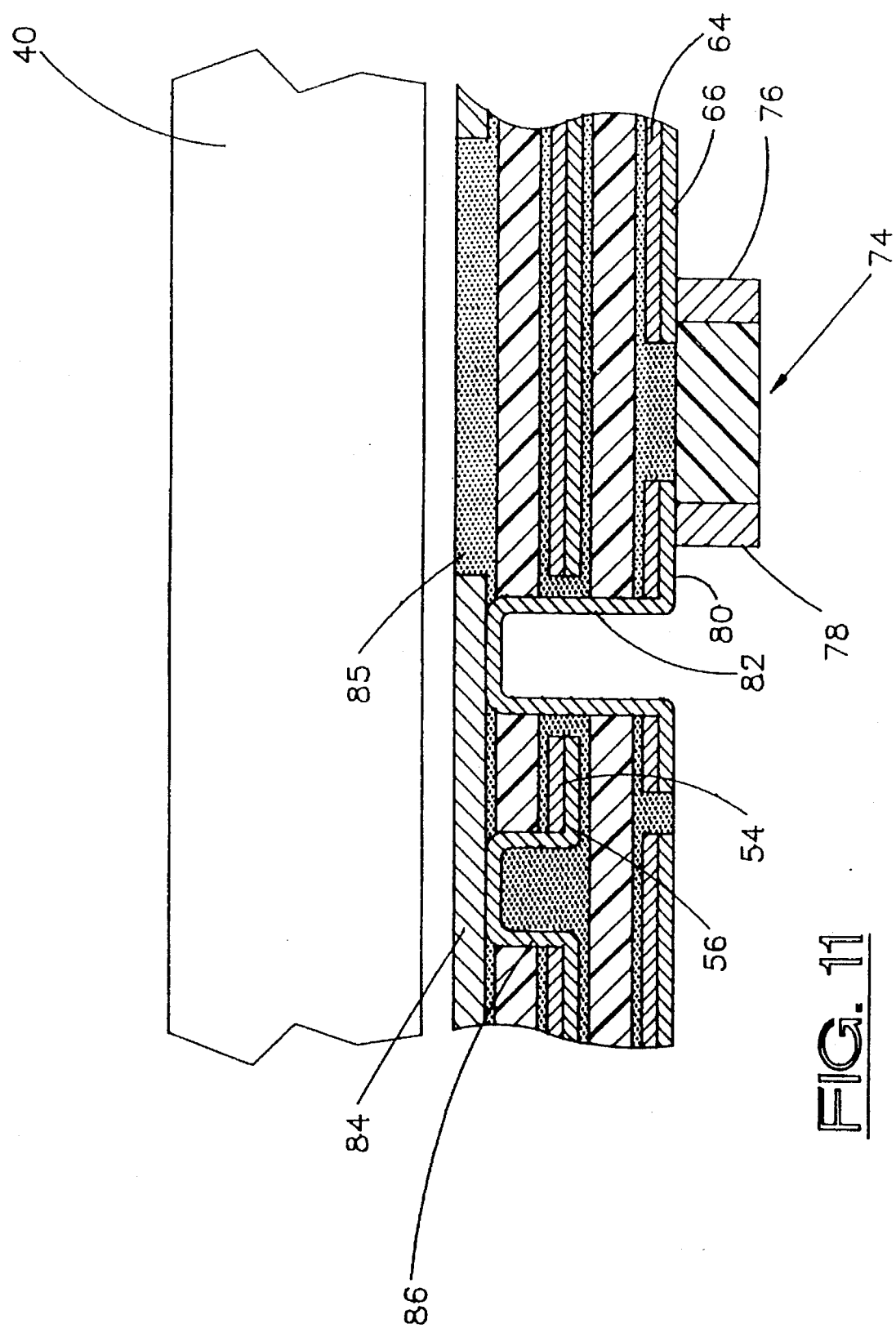
FIG. 11 is a view like FIG. 7 showing a decoupling capacitor incorporated in the embodiment of FIGS. 8–10.

As shown in FIG. 11, a decoupling capacitor 74 can also be incorporated in the area array flip TAB interconnect device between the ground plane 54, 56 and the power plane 64, 66.

It will be noted that in the embodiment of FIGS. 1–6, the die 40 is located on the circuit board 72, and the interconnect device is positioned over the die. In the flip TAB embodiment of FIGS. 8–10, the orientation of the interconnect device is flipped 180° and the die 40 is spaced from the circuit board 42 and is supported on top of the interconnect device. While it is known that flip TAB requires a smaller "footprint" than conventional TAB, the area array flip TAB of this invention can achieve an even smaller footprint, because the size of the die can be reduced so less "real estate" on the circuit board is used for the interconnect function.

As with the first embodiment, ground is to be supplied to tabs 20A, and power is to be supplied to tabs 20B. Once again, the power plane and/or ground plane can be split into two or more electrically isolated separate parts to deliver different power and/or ground levels through separate tabs 20A–20D and contact strips 17A–17D.

The area array interconnect device of the present invention has several important features and advantages over the prior art of both the conventional and flip TAB configurations. One of the more important features and advantages is that with power and ground connection brought into the center of the device for delivery to the IC, all of the peripheral leads can be devoted to signal input and output. In the prior art, up to 30% of the peripheral I/O leads (i.e., leads 26) have to be devoted to power and/or ground. In the present invention, however, the leads that would, in the prior art, have to be devoted to power and/or ground can be devoted to signal input and output. Thus, for a given size device, the number of leads available for signal input/output is greatly increased. Conversely, for a given capacity device the size of both the TAB interconnect and the IC die can be significantly reduced. By way of example, for a 600 lead device (e.g., a TAB with 150 leads per side), about 180–200 leads would be devoted to power and/or ground in a typical prior art device, and 420–400 leads would be available for signal input/output. With the present invention, however, where power and/or ground are brought into the center area of the interconnect device for delivery to mid pads on the I/C die, all 600 I/O leads are available for signal, so the I/O signal capacity of the device would be increased by close to 50%. Conversely, if the design requirement only calls for 400 I/O leads, the size of the TAB device and the IC die can be reduced from the size necessary to accommodate 600 peripheral leads (150 per side) down to the size needed for 100–105 per side. This results in a much smaller "footprint" for the interconnect device, thus saving "real estate". That, of course, is a very important consideration in many applications. Alternatively, the size of the IC die and the TAB interconnect can remain the same and the pitch (i.e., spacing) of I/O leads can be increased, thus simplifying the manufacturing process and reducing problems of aligning the I/O leads with die bond pads on the IC.

The ability to bring ground and/or power into the center of the device also results in greater flexibility in design routing of I/O signals, since the need to integrate ground and/or power into the peripheral routing scheme is eliminated.

The interconnect device of the present invention is also characterized by lower inductance and moderately higher capacitance than typical prior art TAB devices and, hence, reduced switching noise. The low inductance is the result of the short (i.e., distance) paths from the ground and/or power planes to the contact pads on the die. Also, the presence of the ground and power planes inherently reduces inductance and moderately increases capacitance.

Another important feature and advantage of the present invention is that it makes possible simplification of the I/C chip, per se. Present I/C chip designs must incorporate ground and power planes in the chip. With the present invention, the ground and power planes of the I/C chip can be eliminated and replaced by the ground and power planes of the interconnect device. That results in a significant reduction in complication of the IC chip by transferring to the interconnect device some of the structure and function previously required to be present in the chip. In addition, the power and ground planes in the chip are usually very thin (around 5 microns) layers of aluminum, both the material and thickness contributing to high resistance. With the present invention, the high resistance power and ground layers of the chip can be replaced by copper layers of greater thickness (about 25 microns) in the interconnect device, both of which contribute to lower resistance.

With prior art interconnect devices of the TAB type (and others) the inboard ends of the I/O leads (i.e., the ends intended to be connected to the peripheral die bond pads) are cantilevered prior to being connected to the die. That is, they are supported at one end on the frame (e.g., frame part 14), and they extend into the central area which is an open window. This, of course, poses problems regarding maintenance of accuracy of lead spacing and positioning. Those problems are also alleviated with the present invention, because the I/O leads are supported at both ends. The outboard ends are supported by the frame and the inboard ends are supported by the central body structure of the ground and power planes.

The embodiment of the present invention wherein a decoupling capacitor is incorporated is particularly advantageous. The mounting of the decoupling capacitor directly on the interconnect device results in the shortest possible path between the decoupling capacitor and the power/ground planes and connections to the IC die, so the capacitance is realized with a minimum amount of added inductance, thereby reducing switching noise. It appears that this is about the shortest physical path possible for capacitive decoupling of an IC, thereby probably achieving the greatest possible reduction in switching noise.

In addition to the above, for the flip TAB embodiment, the "footprint" can be reduced even beyond the reduction known to be achievable from the known flip TAB approach.

The foregoing discussion has focused on a three layer device, i.e., a signal plane (where the I/O leads and the central arrays of power and ground leads are located), a ground plane, and a power plane. It will be understood that devices with four or more layers (e.g., signal plane, ground plane, power 1 and power 2 layers) are also within the scope of this invention. It will also be understood that a two layer device (i.e., signal plane, with central arrays and a ground or power plane) is within the scope of this invention, but at least a three layer device is by far the preferred configuration.

Manufacture of the device of the present invention is effected by a process which is similar to that in application Ser. No. 352,112 and in copending application Ser. No. 601,927 for "Multilayer Interconnect Device and Method of Manufacture Thereof" filed Oct. 23, 1990 and assigned to the assignee hereof, but with modifications specific and important to the product of this invention. The manufacturing process is shown in FIGS. 12 through 28.

In the process of the present invention, the TAB circuit is made in a manufacturing process by which a plurality of TAB circuits are formed simultaneously in a sheet on a backer or support structure. The individual TAB circuits are singulated by excising from the sheet at the end of the manufacturing process. FIGS. 1 and 2 show one such device of a plurality formed in the manufacturing, the irregular line around the device signifying that it is one unit on a sheet of a plurality of such units.

Referring first to FIGS. 12 and 13, a stainless steel carrier or base plate 110 and a release layer 112 form the support structure on which a plurality of interconnect devices are formed in the manufacturing process. Base plate 110 can be of other metallic or nonmetallic materials, the requirement being that it be flat, dimensionally stable, and have a highly polished conductive surface. While a plurality of interconnect devices are formed on carrier plate 110, only one such device is shown and described herein. It will, however, be understood that a plurality of such interconnect devices are all formed at the same time on the surface of plate 110. Plate 110 is of sufficient thickness to form a rigid and secure carrier for the manufacturing process to assist in precise line control. Release layer 112 consists of a thin layer 112A of nickel electroplated to plate 110 and a thicker layer 112B of copper electroplated on top of the nickel layer. Since neither the nickel nor the copper are strongly adherent to the stainless steel plate (thus constituting a release layer relative to the stainless steel plate), the layers of nickel and copper are formed to extend over the entire surface of plate 110 (only a portion of which is shown in the drawings) and to wrap around the sides of plate 110 and to extend at least a short distance along the back (i.e., bottom) surface. This serves to lock the release layer to the stainless steel plate to give dimensional stability to the stainless steel plate/release layer structure for the manufacturing process, while permitting easy release of stainless steel plate 110 from release layer 112 when it is desired to do so near the end of the manufacturing process. Release layer 112 is about 1 mil. (0.001") thick. The step of forming release layer 112 on stainless steel plate 110 is indicated at step A in FIG. 28. The nickel/copper release layer concept is disclosed in U.S. Pat. Nos. 4,159,222 and 4,306,925. Prior to plating the nickel on the stainless steel plate, the plate is highly polished and inspected for flatness, and the surface is chemically cleaned and activated with an alkaline electrocleaning treatment to remove any oxide buildup. This processing of the plate 10, coupled with the wrap feature, produces the desired release layer which will be adherent during the process and releasable at the end of the process.

For the next step in the manufacturing process, a standard photoresist process is employed to define lines on the upper surface of release layer 112 on which copper leads 26, 28 and 30 are to be formed. That is, a resist material is deposited on the upper surface of release layer 112, and the resist layer is then photoexposed through suitable artwork to define a pattern of areas (i.e., over the surfaces 114) where undeveloped resist is washed away, and the rest of the upper surface of layer 112 remains covered with photoresist. As a final step in this photoresist patterning, a plasma etch cleaning step is performed to clean out the areas where the photoresist has been washed away to obtain sharp, clean, fine leads. The photoresist, with portions removed to define the surfaces 114 is shown in FIG. 12. This photoresist patterning step is indicated at step B in FIG. 28.

Signal leads 26, ground leads 28 and power leads 28 are then formed by electroplating on the surfaces 114. A three step electrodeposition process is used whereby each lead 26, 28 and 30 is formed first by electroplating a thin layer A of gold on surface 114, then electroplating a main layer of copper B and then electroplating another thin layer C of gold. Other electroplatable metals such as tin or nickel, may be used instead of the gold layers A, C. The total thickness "T" of each lead 26, 28, 30 is about 0.001"; and the width "W" of each lead and the spacing between adjust lead 26 or between adjacent leads 28 or 30 may be as fine as 1 to 2 mils (0.001"–0.002"). It will be understood that FIG. 13 is a partial view and that only one each of the signal leads 26 and one each of the ground and power leads 28, 30 are shown in FIG. 13 for purposes of illustration. The busses 36 and 38 from which the ground and power leads 28 and 30 extend are also formed in this step, also with the three layers of A, B, C of gold, copper and gold. The entire device may have in the range of 400 or more peripheral leads 26. Thus, for a single device, such as shown in FIGS. 1 and 2, having 100 peripheral leads per side, there would be a total of 400 of the leads 26. The step of pattern plating leads 26, 28, 30 and busses 36, 38 is indicated at step C in FIG. 28. The remaining resist material on the surface of release layer 112B is then removed to leave exposed leads 26, 28, 30 and busses 36, 38 on the upper surface of layer 112B. The resist removal step is indicated at step D in FIG. 28. FIG. 13 shows the electroplated leads with the resist still in place, and FIG. 14 shows the manufacturing stage where the resist has been removed.

As an integral part of the photoresist patterning of step B and the plating of step C, a plurality of registration features 115 (see FIGS. 1 and 2) are also located and formed on release layer 112 to serve as markers for accurate location of via holes in a later stage of the manufacturing process. A number of such registration features 115 are formed on release layer 112 over the expanse of plate 110, to serve as registration markers for all of the interconnect devices formed at the same time in the manufacturing process, but only two are shown in FIG. 1. As will be obvious, to ensure sighting of the registration features during all manufacturing steps, the resist material should be translucent or transparent, and holes are formed at the registration sites in all layers of laminate used in building up the product.

Next, a single clad laminate of copper 54 bonded by an adhesive 52 to an insulating substrate 50 is placed on top of the leads 26, 28, 30 and the busses 36, 38. The laminate includes an exterior layer of adhesive 48. The adhesive is activated by heat and pressure; it may be, e.g., a phenolic butaryl epoxy known as 9870 available from Rogers Corporation, the assignee hereof. Initially the laminate is supported on top of the leads (as shown in FIG. 14A) and does not surround the leads as shown in FIG. 15. This step of positioning the laminate is indicated at step E in FIG. 28. Heat and pressure are applied to bond the laminate to the leads 26, 28, 30 and to release layer 112 as shown in FIG. 15. The laminate may, e.g., be a layer of ½ oz. copper 54 bonded by a layer of adhesive 52 (e.g., 8970 identified above) to a layer of laser etchable polyimide 50. Other laser etchable dielectrics such as fluoropolymer composites, fluorimides, polyamide-imides, etc. and adhesives may be used instead of the described insulation system. It is important to position the laminate so that the copper layer 54 faces away from leads 26, 28, 30. The application of heat and pressure causes the adhesive layer 48 to flow around and between the leads 26, 28, 30 as shown in FIG. 15. The step of bonding the laminate is indicated at step F in FIG. 28. The laminate (including film 48) is prepunched with holes to align with the registration features 115 to leave the registration features visible from the top of the assembly for accurate location of the vias in a subsequent step in the manufacturing process. Alternatively, adhesive 48 may, if desired, be a free film rather than an integral part of the laminate 50, 52, 54, and/or adhesive 52 could be eliminated and copper layer 54 could be bonded directly to insulating substrate 50.

Figure 16B:
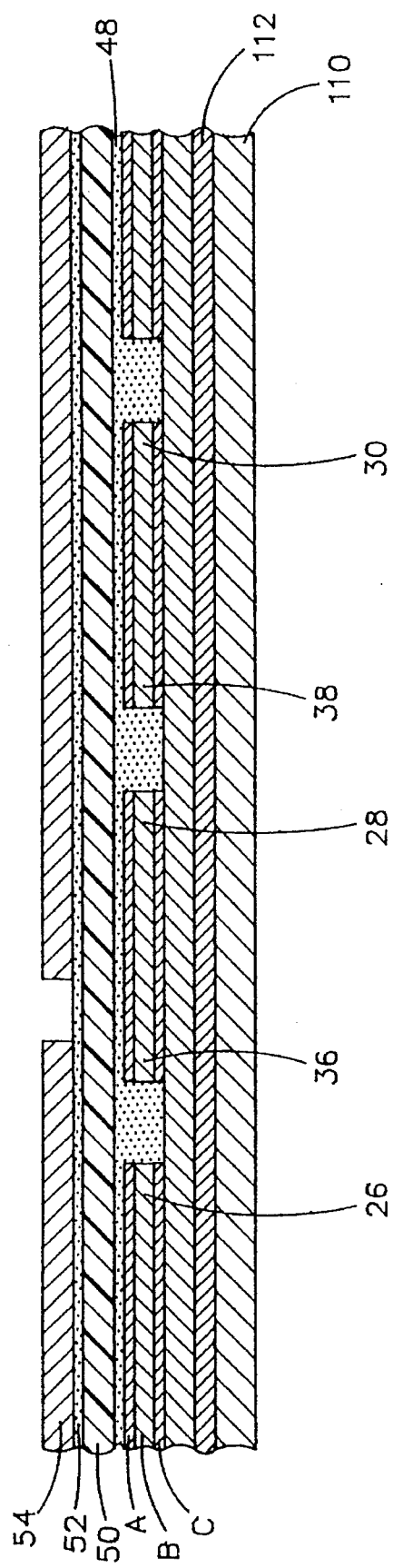
Figure 16C:
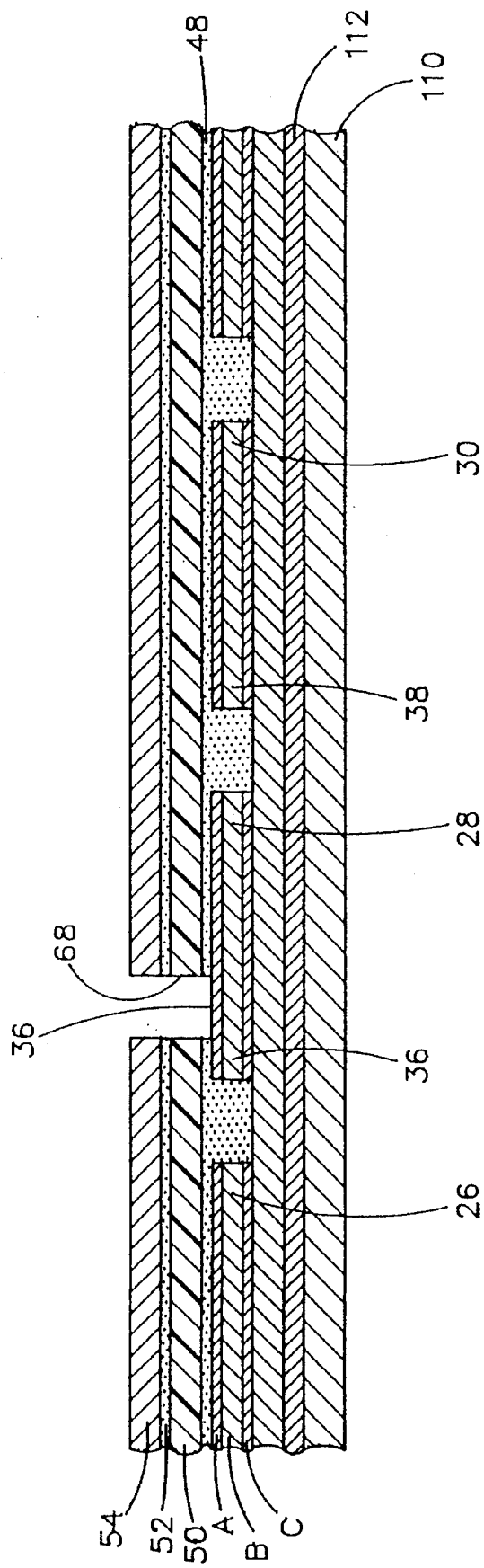

After the laminate has been bonded to the assembly, a first series of via holes 68 are formed in the assembly (see FIGS. 16A, B, C and 17) to permit electrical contact to be made with the busses 36 of the leads 26. Only one via hole is shown in FIG. 16C, but it will be understood that as many of the first series of via holes as desired can be formed. Preferably, several of the vias 68 will be formed to connect to each bus 36 of each group of leads 26 which will serve as the ground leads in the final assembly of the interconnect device to an IC or other electronic component. To form the first series of vias, a layer of photoresist is applied to copper layer 54, and the photoresist is photographically exposed and developed to remove the photoresist only in locations where the first series of vias are to be formed (see FIG. 16A). The location of the areas where the photoresist is to be removed is accurately determined by reference to previously formed registration features 115. It will be appreciated that the via holes 68 must be accurately located, and the presence of the registration features 115 makes it possible to do so. After the photoresist has been removed at the locations of the vias, the copper in layer 54 at the via locations is removed by etching to expose adhesive layer 52 (see FIG. 16B). The remaining photoresist is then stripped to expose all of the remaining copper surface 54. The adhesive layer 52, the dielectric layer 50 and the adhesive layer 48 in the via path are then all removed by a suitable laser beam (such as a $CO_2$ or UV laser) acting as a drill (see FIG. 16C). The exposed copper layer 54 constitutes a mask for the laser drill. The laser scans the surface 54 with no effect except in those locations where the copper in layer 54 has been etched away to expose adhesive layer 52. At those locations, the laser beam drills (ablates) through the dielectric materials of layers 52, 50 and 48 to expose the plated surfaces of the busses 36 (see FIG. 16C). The via holes 68 are then cleaned by any standard technique (e.g., plasma cleaning, vapor honing, etc.) to define sharp and clean walls in the via holes and a clean exposed surface at layer of the bus 36. The step of forming the first series of via holes is indicated at step G in FIG. 28.

Figure 17:
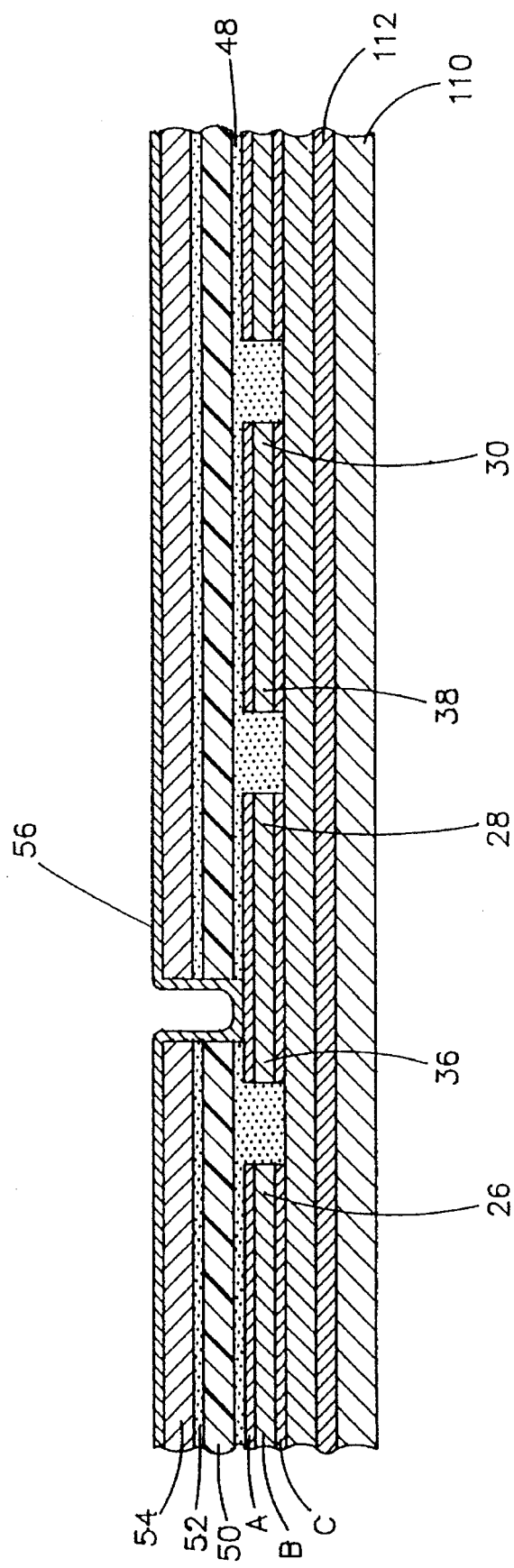

Referring to FIG. 17, copper 56 is then plated to the exposed parts of the busses 36, along the walls of via holes 122 and to the exposed surface of copper layer 54 to complete the via and form an electrical connection from busses 36 and leads 28 to copper layer 54/56 which serves as a ground plane in the final product. Copper layer 56 is formed in a two step process where first a very thin layer of copper is formed by electroless deposition or by a vacuum deposition method such as sputtering, and then the remainder of layer 56 is formed by electroplating.. The total thickness of layer 56 is about ½ mil (0.0005"). The combined layers 54, 56 constitutes the ground plane of the device. The formation of layer 56 to connect the busses 36 and hence the leads 28 to the ground plane is indicated at step H in FIG. 28.

Figure 18:
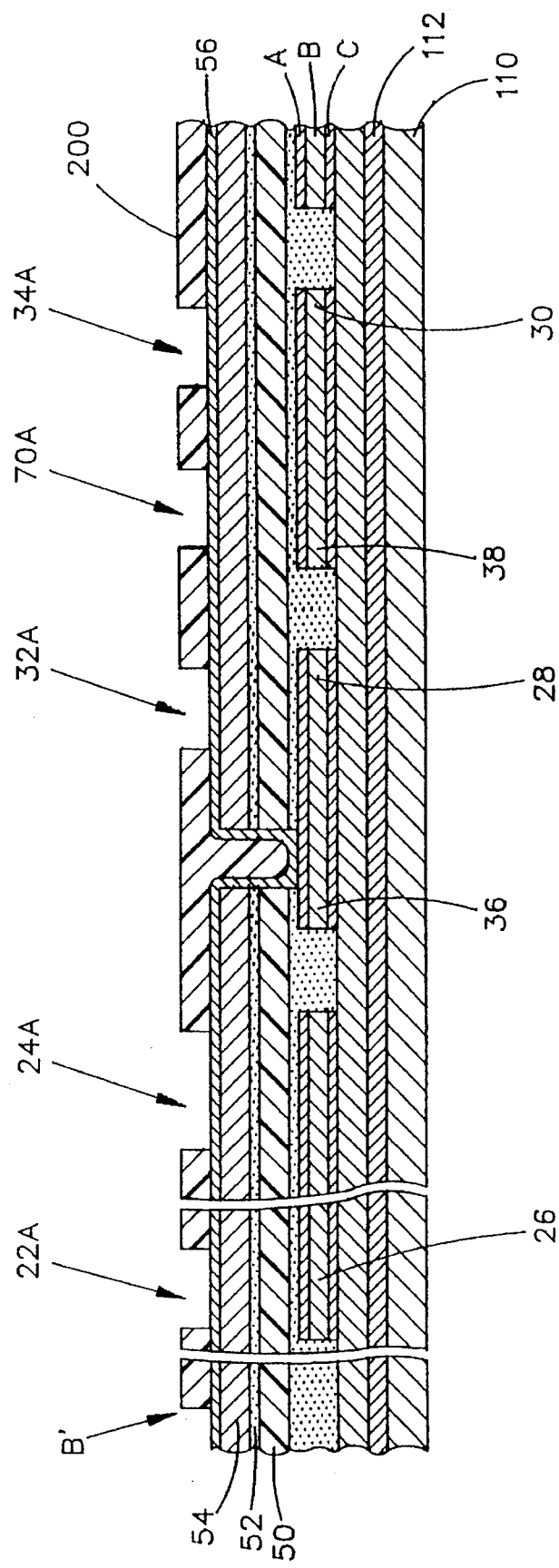
Figure 19B:
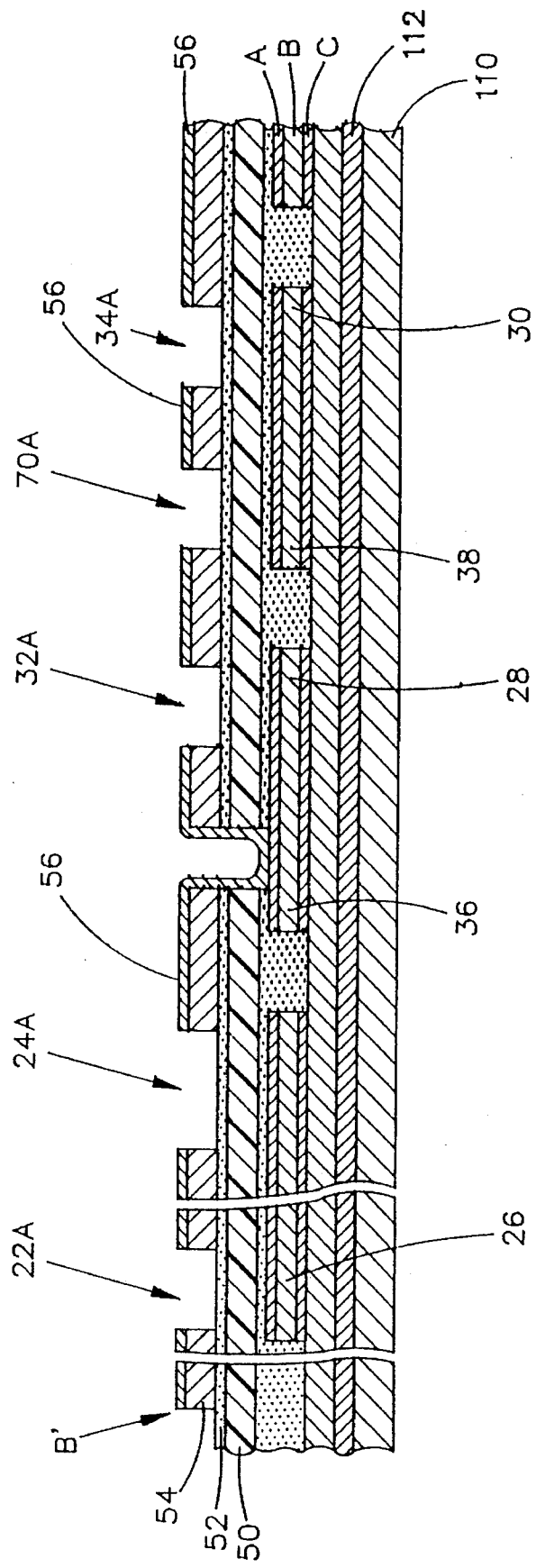

Referring to FIGS. 18 and 19, another layer of photoresist 200 is next applied to copper layer 56, and photoresist layer 200 is then imaged and developed to define sites for both (1) a second set of vias 70 for connection between the busses 38 of the power leads 30 and the second voltage (power) plane 64/66 (see, e.g., FIG. 4) and (2) die bond pad openings or windows 24, 32 and 34 (for later insertion of a bonding tool to effect bonding of the leads 26, 28 and 30 to their respective die bond pads on the I/C die), and (3) outer window 22 in the FIG. 1 embodiment, and (4) a peripheral boundary B' for the device for ultimate singulation of the device from the plurality of such devices formed in a single sheet. The resist imaged and developed to form the via site 70A, window sites 22A, 24A, 32A, 34A is shown in FIG. 18. The patterning for the second vias, windows and boundary is indicated at step I in FIG. 28. The copper in layers 56 and 54 is then etched to remove the copper at the location of the via site 70A, window sites 22A, 24A, 32A, 34A and boundary B' formed in photoresist layer 200. FIG. 19A corresponds to FIG. 18 and shows the copper in layers 56 and 54 etched away at the mark via site 70A, the window sites 24A, 32A, 34A and boundary site B'. The sites formed in photoresist 200 and the copper areas etched away in copper layers 56 and 54 are slightly enlarged relative to the actual sizes of the vias, windows and boundary to be formed in the device, the purpose of this enlargement being to insure that the copper in layers 56, 54 does not act as a mask for a subsequent laser ablation step in which the copper in a third conductive layer (i.e., the power plane) will act as the laser mask for forming the windows, the second set of vias and the boundary. This enlargement also ensures electrical isolation between the ground and power planes during the subsequent steps where the second set of vias are formed, as will be described hereinafter. After the copper in layers 56, 54 is etched, photoresist 200 is removed (see FIG. 19B). The step of forming the window and via and boundary sites in photoresist layer 200 and the etching of these sites in copper layers 56, 54A are indicated at Steps I and J of FIG. 28.

Figure 20:
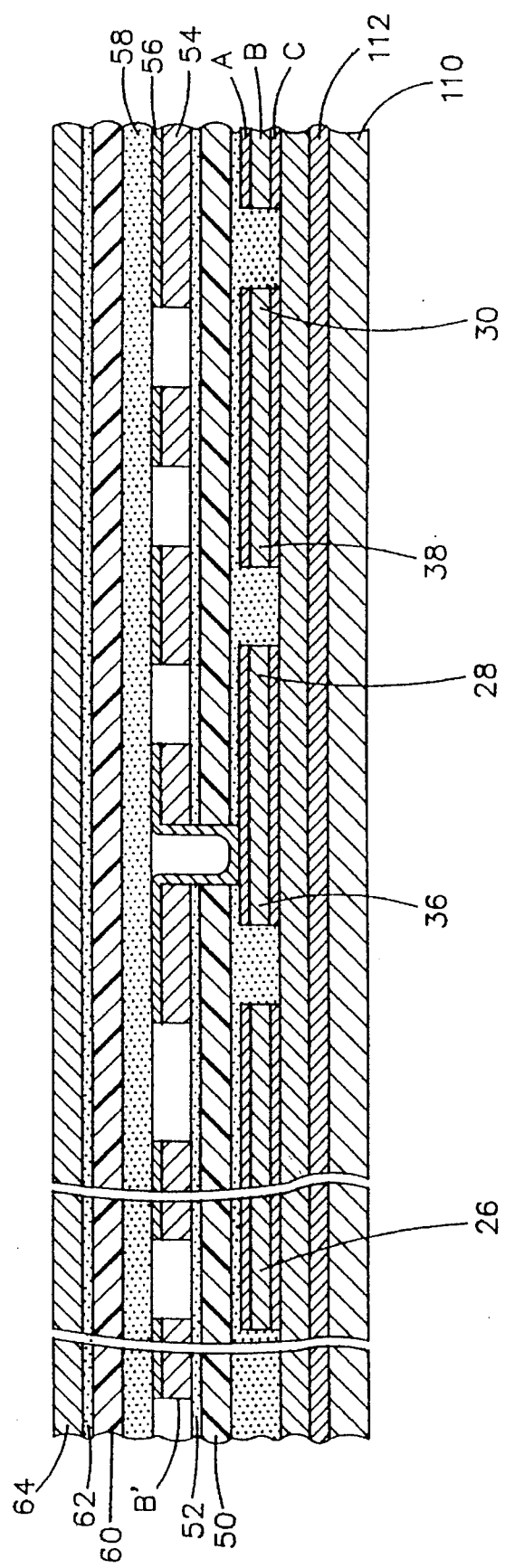
Figure 21:
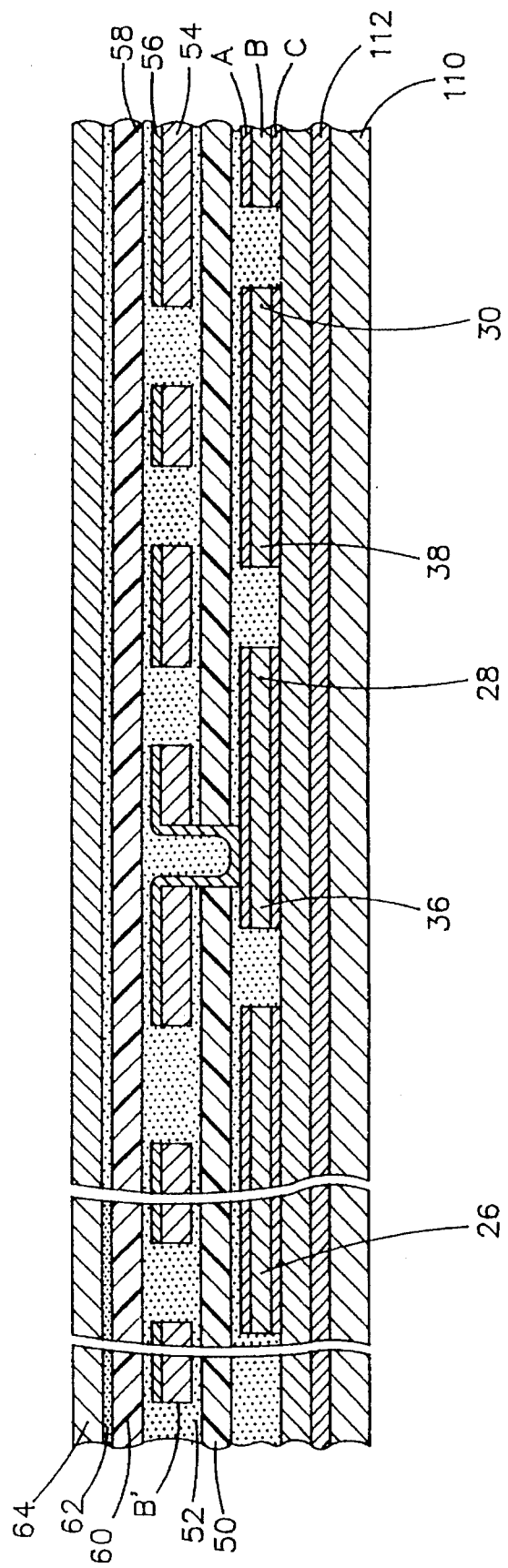

Referring to FIGS. 20 and 21, next, another single clad laminate of copper 64 bonded by adhesive 12 to an insulating substrate 60 is placed on top of copper layer 56 adhesive film 58. The laminate includes an exterior layer of adhesive 58 which is activated by heat and pressure. Adhesive layer 58 is preferably of the same material as adhesive layer 48. This step of positioning the laminate is shown at Step K of FIG. 28. Heat and pressure are applied to bond the laminate to copper layer 56, as shown in FIG. 21. This second laminate is preferably the same material as the first laminate; i.e., the second laminate has a layer of ½ oz. copper 64 bonded by a layer of adhesive 62 to a layer of laser etchable polyimide 60. As with the first laminate, other laser etchable dielectrics and adhesives may also be used. The second laminate is placed with copper layer 64 facing away from copper layer 56, 54 and with dielectric layer 60 and adhesive 58 facing copper layer 56. The application of heat and pressure causes adhesive 58 to flow into the window and via and boundary sites in copper layers 56, 54 and to bond the second laminate to copper layer 56, 54. The second laminate (including adhesive 58) is prepunched with holes to align with the registration features 115 to leave the registration features visible from the top of the assembly for accurate location of the vias and windows in subsequent manufacturing steps. The step of bonding the second laminate to copper layer 56, 54 is indicated at Step L in FIG. 28. Alternatively, adhesive 58 may, if desired, be a free film rather than an integral part of the laminate 60, 62, 645, and/or adhesive 62 could be eliminated and copper layer 64 could be bonded directly to insulating substrate 60.

Figure 22A:
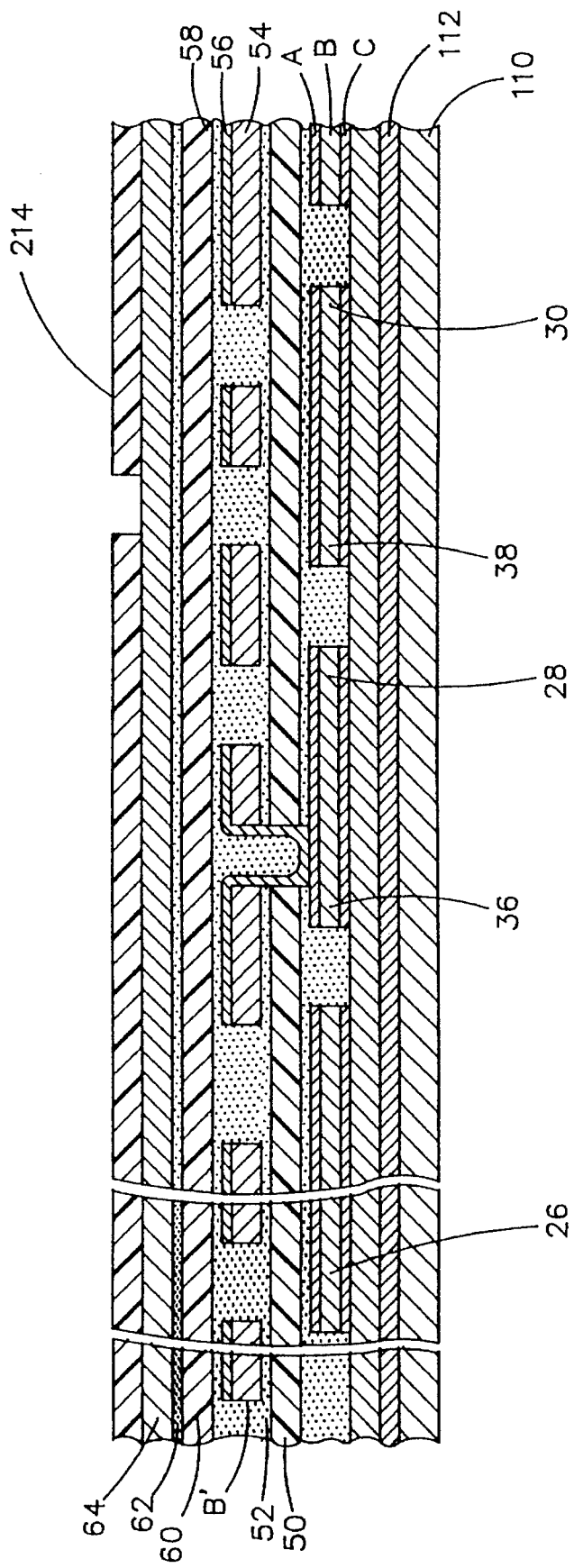

After the second laminate has been bonded to the assembly, a series of second via holes 70 are formed in the assembly to permit a second series of electrical contacts to be made with the busses 38 of the power leads 30. Referring to FIGS. 22 and 23, only one of these second via holes is shown, but it will e understood that as many of the second series of via holes as desired can be formed. Preferably, several vias will be formed to connect to each buss 38 of each group of leads 30 which will serve as power lead in the final assembly of the interconnect device to an IC or other electronic component. Referring to FIG. 22A, a layer of photoresist 214 is applied to copper layer 64, and the photoresist 214 is photographically exposed and developed to remove the photoresist only in locations where the vias 70 are to be formed. The location of the areas where the photoresist is to be removed is accurately determined by reference to previously formed registration features 115. It will be appreciated that the via holes 70 must be accurately located, and the presence of the registration features 15 makes it possible to do so.

Figure 22B:
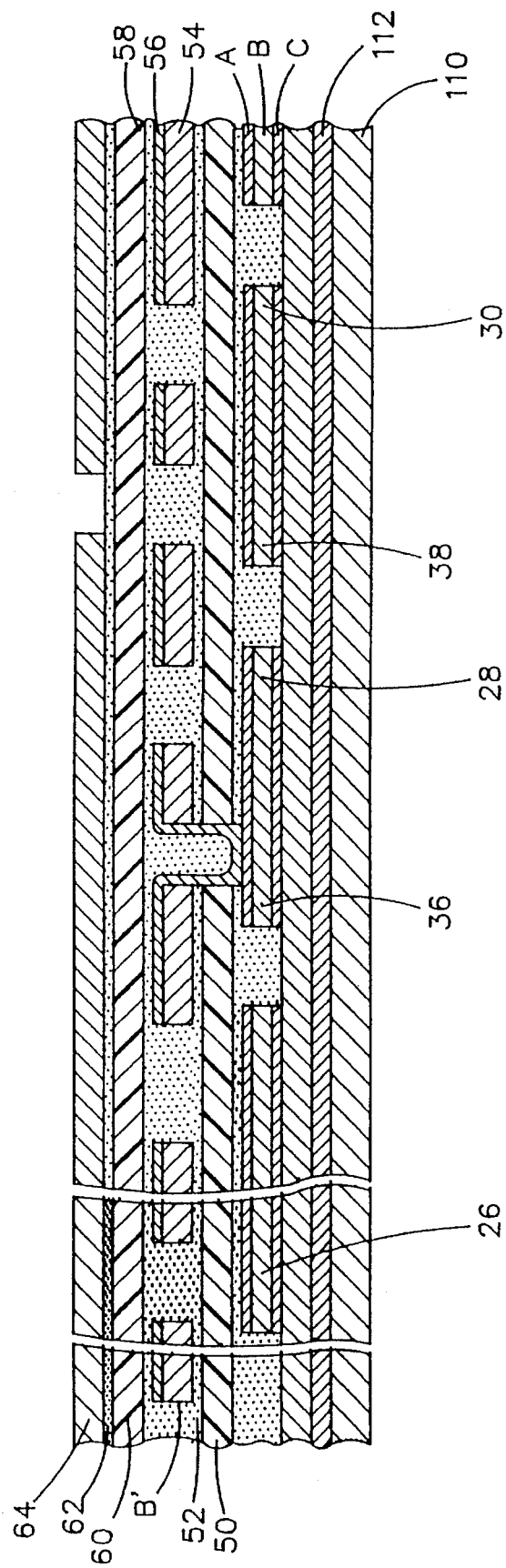
Figure 22C:
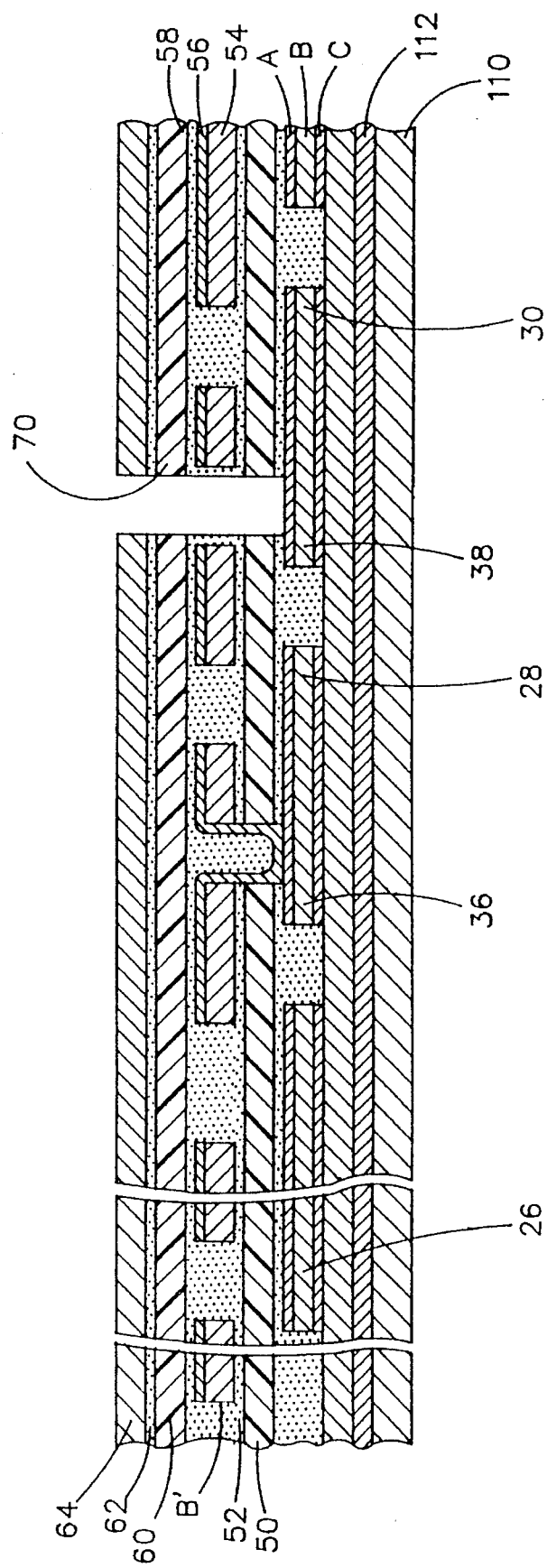
Figure 23:
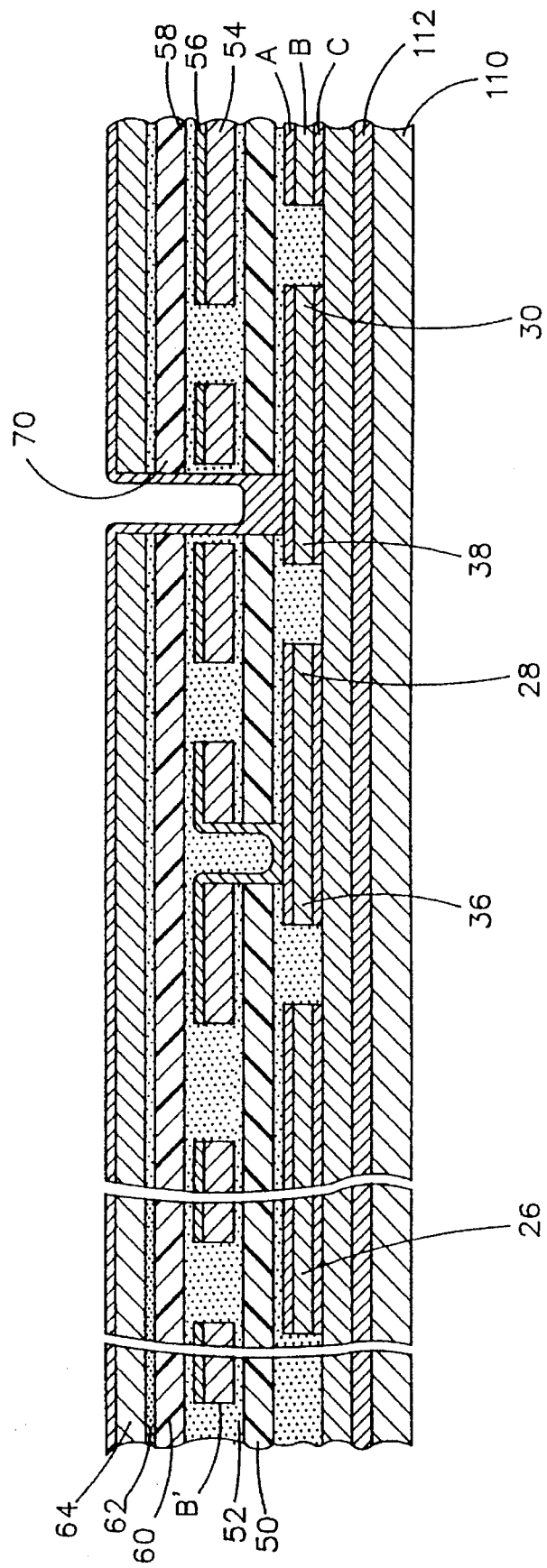

After the photoresist has been removed at the locations of the second series of vias, the copper in layer 64 at the via locations is removed by etching to expose adhesive layer 62 (see FIG. 22B). The remaining photoresist 214 is then stripped to expose all of the remaining copper surface 64. The adhesive layer 62, the dielectric layer 60 and the adhesive layer 58 in the via paths are then all removed by a suitable laser beam (such as a $CO_2$ or UV laser) acting as a drill (see FIG. 22C). The exposed copper layer 64 constitutes a mask for the laser drill. The laser scans the surface of copper layer 64 with no effect except in those locations where the copper in layer 64 has been etched away to expose adhesive layer 62. At those locations, the laser beam drills (ablates) through the dielectric materials of layers 62, 60, 58, 52, 50 and 48 to expose the plated surfaces of the busses 38. The via holes 70 are then cleaned by any standard technique (e.g., plasma cleaning, vapor honing, etc.) to define sharp and clean walls in the via holes and a clean exposed surface at layer of the busses 38. It is at this point that it be noted that the opening in copper layer 64 (which is made to be of smaller diameter than the previously formed oversized openings in copper layer 54, 56) determines the size of vias 70, because the vias pass through the previously formed oversized openings in copper layers 56, 54 so that those latter copper layers do not perform any masking function for the laser drill. The step of forming the via holes and windows is indicated at step M in FIG. 28.

Referring to FIG. 23, copper layer 66 is then plated to buss 38, along the walls of via holes 70 and to the exposed surface of copper layer 64 to complete the second vias and form an electrical connection from the busses 38 of power leads 30 to copper layer 66, 64 which serves as a power plane in the final product. Copper layer 66 is formed in a two step process where first a very thin layer of copper is formed by electroless deposition or by a vacuum deposition method such as sputtering, and then the remainder of layer 66 is formed by electroplating. The total thickness of layer 66 is about ½ mil (0.0005"). The combined layers 66, 64 constitutes the power plane of the device. The formation of layer 66 to connect the busses 38 and leads 30 to the power plane is indicated at step N in FIG. 28.

Figure 24:
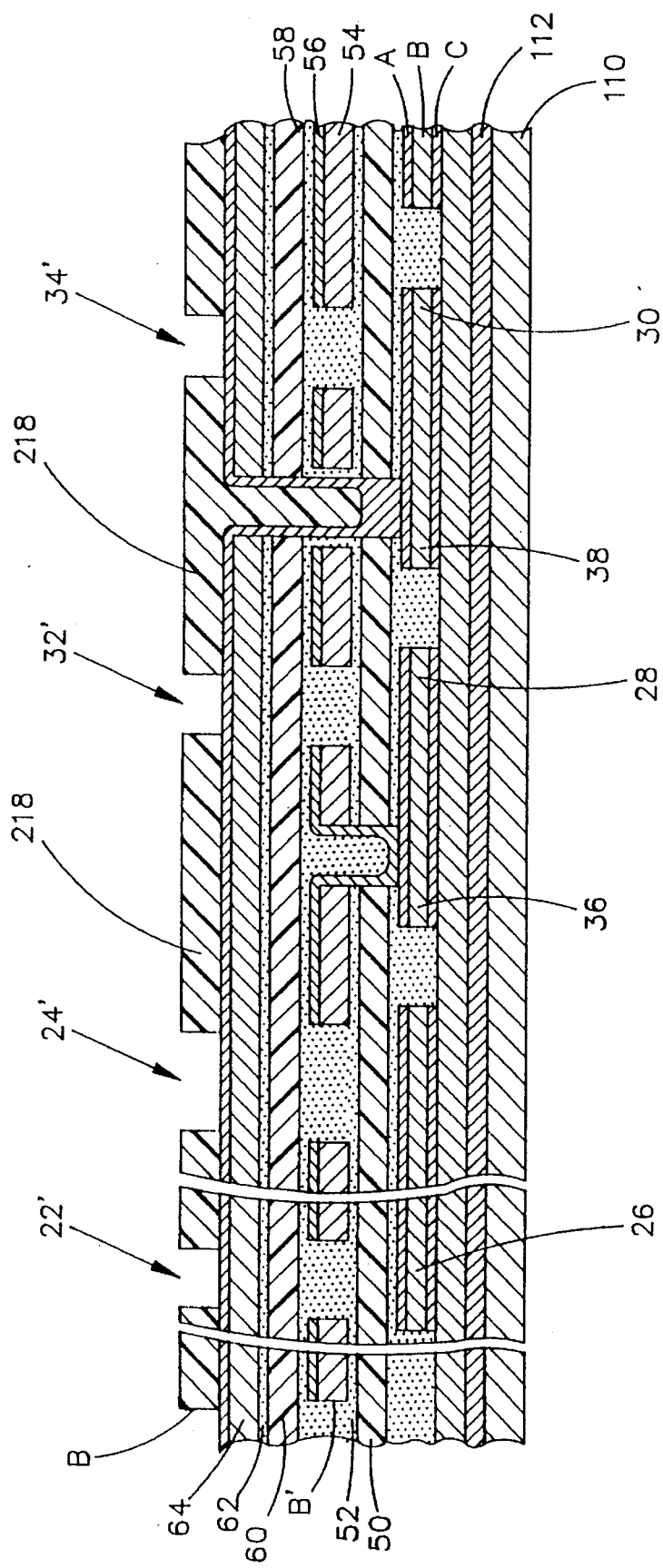
Figure 25:
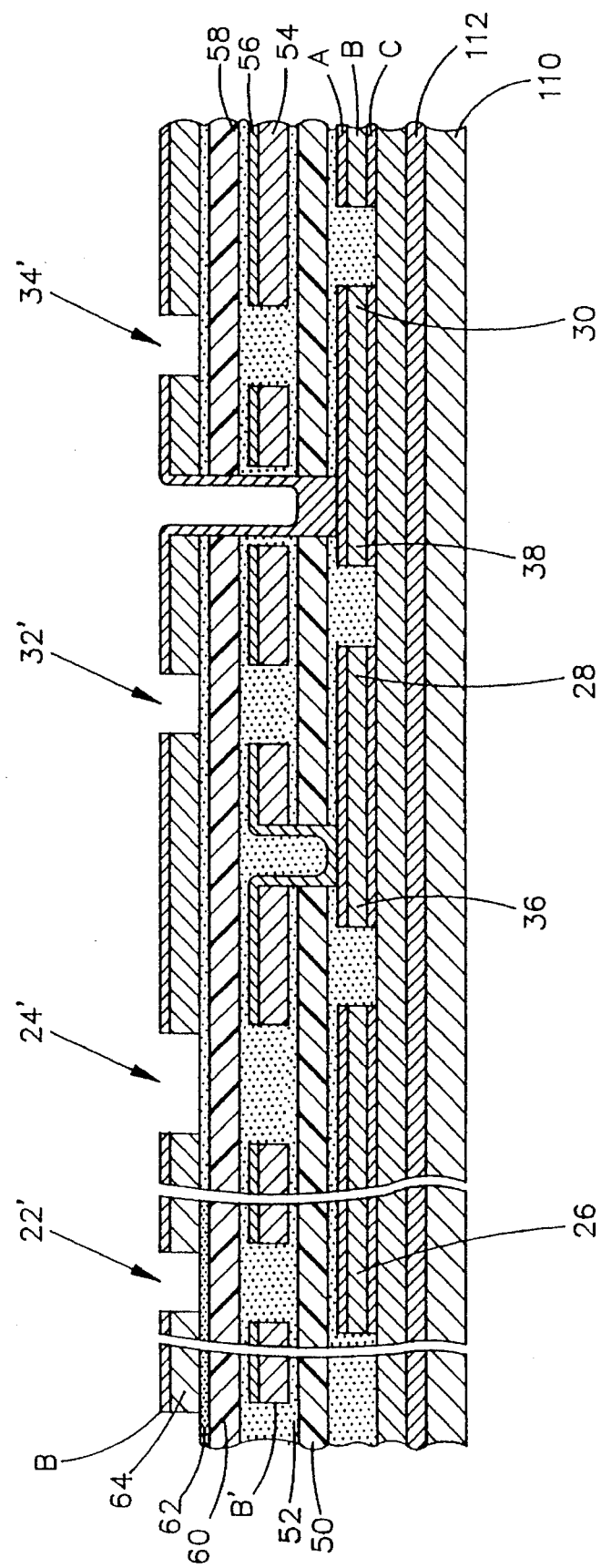
Figure 25A:
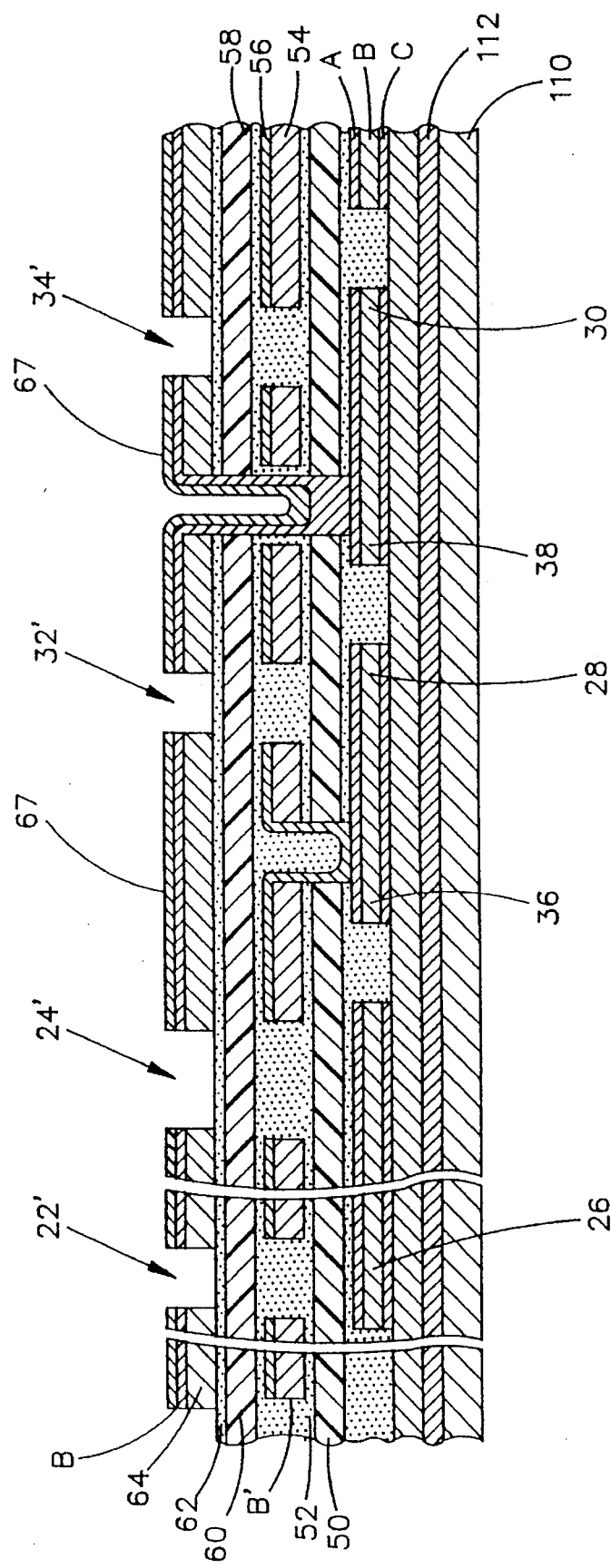
Figure 26:
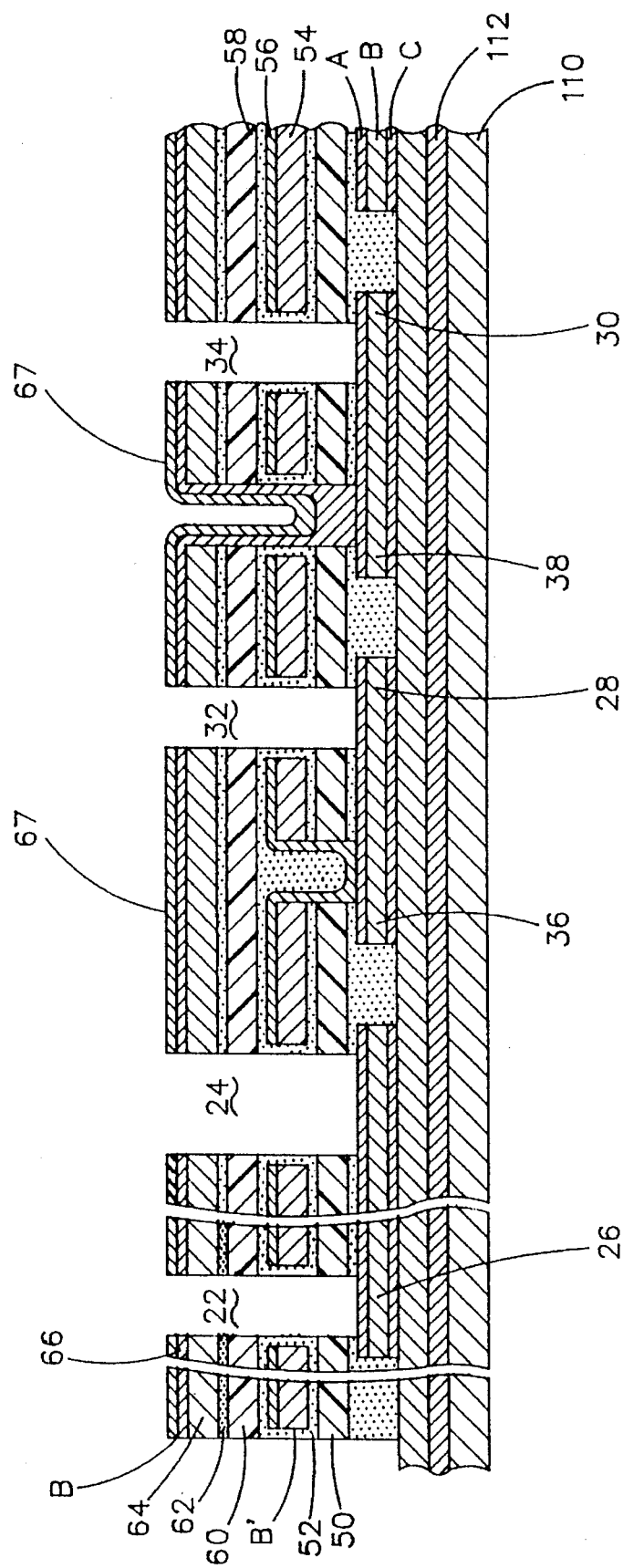
Figure 27:
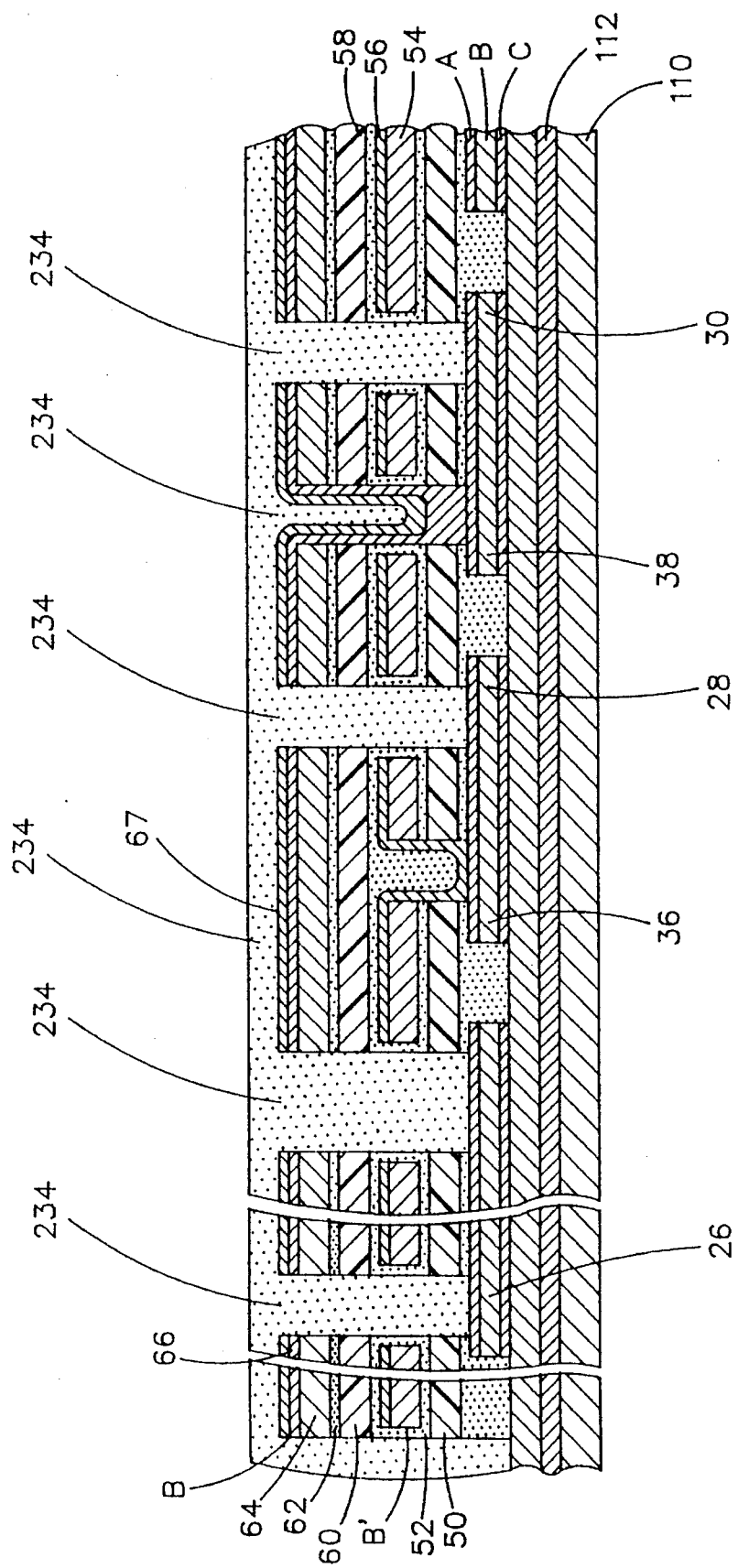

Another layer of photoresist 218 is then applied to copper layer 66, and the photoresist is exposed and developed to define the windows or void areas 22, 24, 32, 34, respectively, and boundary B to be formed in the device (see FIGS. 1, 2, 3 and 4). The photoresist is removed to expose copper layer 66 only in those sites 21', 24', 32' and 34' where the windows 22, 24, 32 and 34, respectively, and Boundary B are to be formed, and the exposed copper in layer 66 and layer 64 is then etched to remove the copper at those sites. The exposed resist prior to etching of exposed copper layer 66 and copper layer 64 is shown in FIG. 24. After the copper is etched, the photoresist is stripped from the remainder of copper layer 66 (see FIG. 25), Referring next to FIG. 25A, a layer of gold, gold/nickel, or other laser resistant material 67 may then be electroplated to layer 66 to protect the power plane against oxidation and chemical attack during subsequent etching to remove the device from the release layers. Alternatively, a protective fugitive material 234 (to be applied later in the process (see FIG. 27 and related description)) can be used to provide such protection. Next in the process, the layers of adhesive 62, dielectric 60, adhesive 58, adhesive 52, dielectric 50 and adhesive 48 are ablated by the laser to remove those layers all the way down to leads 26, 28 and 30 and to copper release layer 12 at boundary B where the leads 16 are not present (see FIG. 26) to form windows 22, 24, 32 and 34 and boundary B. Layer 67/66 acts as a drill mask for the laser for this ablation step. The windows can be seen in FIGS. 1, 2, 3, 4 and 26. The formation of windows 24, 32 and 34 forms openings for access to bond the leads 26, 28 and 30 to the die bond pads. The formation of windows 22, together with windows 24 forms the frame structure 12, 14, 16, 20. It will be understood that the frame structure (e.g., 12, 14, 16, 20 or 14A, 20) is formed out of the laminate structure of layers 48, 50, 52, 54, 56, 60, 62, 64, 66. The formation of windows, frames and boundary is indicated at the step O of FIG. 28.

It will be noted that the window sites 22', 24', 32' and 34' are formed undersized relative to the corresponding previously formed window sites in ground plane 54/56 so that the size of the window sites 22', 24', 32' and 34' determine the size of the windows. Note, also, that the boundary B similarly overlaps the boundary B' in the ground plane, so that the actual location of the boundary is determined in the power plane.

After the windows 22, 24, 32 and 34 and frames 12 and 14 and Boundary B have been formed, the windows and boundary spaces between Boundary B of adjacent devices may be filled with a fugitive protective material 234 (see FIG. 27) which covers the power plane, surrounds the leads and extends down to release layer 12 to protect the leads during further processing and handling. This protective material, which should have mechanical and chemical integrity, may, e.g., be a resist material that is either water or solvent soluble. The protective material may remain in place during storage and/or shipment of the device until the device is used (i.e., until the electronic component is attached to it). The protective material also assists in holding the individual parts in a single sheet for subsequent singulation. The introduction of the protective material is indicated at step P in FIG. 28.

After step P, the carrier plate 110 is removed by (a) breaking the wrap of release layer 112 and (b) separating the carrier 10 from release layer 112. This can be done manually since, as previously discussed, release layer 112 is not strongly adherent to plate 110. After removal of plate 110, release layer 112 remains bonded to leads 26, 28 and 30, the busses and adhesive film 48, so it remains necessary to remove release layer 112. This is done by (a) etching away all of nickel layer 112A and then (b) etching away all of copper layer 112B. That leaves the lower surface (gold plated surface A) of the leads 26, 28, 30 and the busses 36, 38 exposed. This etching is accomplished by the use of two standard etches, the first being specific for nickel and the second being specific for copper. The removal of the support plate 110 and release layer 110 is indicated at step Q in FIG. 28.

Upon the removal of plate 110 and release layer 112, the resulting structure consists of a multiplicity of the interconnect devices joined together in a single sheet-like structure. The individual parts are then excised from the sheet-like structure by any convenient means, such as die cutting, laser cutting, etc. The final parts would be as shown in FIGS. 1 and 2, at the boundaries B, but without carrier 10 and release layer 112. Of course, protective material 234 will be removed before the part is put into use.

If desired, the exposed gold in any of the leads and busses 26, 28, 30, 36, 38 and/or layer 67 may be removed by selective etching and replaced by other metals, such as tin or solder, for alternate termination processing if desired. Selective metallization can be carried out at any exposed metal surface whereby different metals can be applied to serve various purposes, e.g., gold for test pads, tin or solder for bonding sites, etc.

In addition to those discussed above, the interconnect device of this invention is a product which can achieve the following features and advantages:

(1) An interconnect device of the lead frame or TAB type with both ground and power planes resulting in low inductance power distribution and reduced switching noise, particularly with advanced IC's.

(2) Impedance control and low crosstalk realized by the presence of a ground or power plane in close proximity to the signal plane.

(3) The ability to incorporate and distribute multiple power and/or ground voltages within the power and/or ground planes.

(4) Fine line width of 2 mils (0.002") or less.

(5) Fine spacing between leads—the spacing being 2 mils (0.002") or less.

(6) Lead planarity (i.e., alignment in a plane within a tolerance of about ±0.001".

(7) Selective application of surface metals (gold, tin, solder, etc.) to improve performance in various applications (testing, bonding, etc.)

(8) Die simplification resulting from incorporation of ground and power planes in the interconnect device.

(9) Size reduction (either of the IC and/or the interconnect package) for a given I/O capacity, or increased I/O capacity for a given size device.

(10) Coat reduction resulting from (1) reduced physical size of the IC die and (2) elimination of ground and power planes from the die.

(11) The IC can be functionally pretested at speed through the interconnect device of the present invention.

Of course, it is possible to practice the method of this invention under less than optimum process control conditions and produce the product of this invention which does not achieve some or all of the above features and advantages. Such product and process would, nevertheless, be within the scope of the present invention. Also, it is to be noted that additional voltage plane layers, e.g., 3 or more, can be incorporated by repeating the process steps by which the second voltage layer was formed as disclosed herein.

Segmentation of the ground plane, if it is to be done, would be done at the same time and in the same manner as the formation of boundary sites B' in steps I and J of FIG. 28.

As previously noted, FIG. 7 shows the interconnection device of the present invention incorporating a decoupling capacitor 74 which is connected between the power and ground planes. From an electrical performance point of view, this decoupled embodiment is preferred. Capacitor 74 has conductive plates 76 and 78 spaced apart by a suitable dielectric. Plate 76 is connected (as by soldering or otherwise) directly to the power plane by being bonded to copper layer 66 (or to gold layer 67 if it is present). The other plate 78 of the capacitor is connected to electrically isolated segment 80 of the power plane. Segment 80 is originally formed as part of the power plane 64/66, but segment 80 is subsequently electrically isolated from the power plane by photoresist masking and etching completely around segment 80 so that segment 80 is electrically isolated from the power plane although it remains physically at the level of the power plane. That masking and etching to electrically isolated segment 80 from the power plane can be accomplished as a part of Step O or as a separate step between Steps P and Q. Segment 80 is connected by a via of the second set of vias to decoupling capacitor lead 84 (formed at the same time as leads 26, 28 and 30), and lead 84 is connected to the ground plane 54/56 by a via of the first set of vias. Thus, plate 78 is connected to the ground plane; and the capacitor 74 is connected across the power and ground planes for decoupling purposes.

In the manufacturing process described above, it is necessary at certain steps to refer to the registration features 15. To obtain sight of the registration features during all manufacture steps, the resist material is translucent, and holes are formed at appropriate places in all layers of laminate used in building up the product.

It will be noted that at the completion of step H, an option exists to go directly to step O (and then steps P and Q), in which event the final device will be an area array device having only one voltage layer 54, 56, and area array busses/ leads 36, 28 and 38/30 located interiorly of I/O lines 26 and connected to the single voltage layer 54/56 by vias 68. As in the FIG. 4A embodiment, voltage plane 54/56 may be either a ground plane or a power plane (depending on the voltage source to which it is connected by vias 68A. Alternatively, as in the embodiment of FIG. 4B, the single voltage plane may be segmented (in step O) to form several discrete voltage planes (all in the same physical plane) to deliver ground and one or more power levels to the area array busses/lines 36/28, 38/30. It will also be understood that decoupling capacitor 74 can also be incorporated in this embodiment, electrically connected between difficult voltage plane segments, if desired. The decoupling capacitor can be connected between voltage plane segments by the island and via structure described above for voltage planes in different physical planes. In that event, the island would be formed in one of the voltage plane segments and the island would be electrically connected to a second voltage plane segment (in the same physical plane) by two vias, one connected to the island and one connected to the second voltage plane segment, with a circuit line connected to the two vias. One plate of the capacitor would be connected to the first voltage segment, and the other plane of the capacitor would be connected to the island. Alternatively, one plate of the capacitor could be connected directly to the second voltage segment; or the plates of the capacitor could be connected to the respective first and second voltage segments in any other way.

If the single voltage layer device is formed by going from step H directly to step O, it will be understood that the procedures of step O will be performed on layer 54/56 rather than on layer 64/66 to form the windows, frames and boundaries. Also, gold layer 67 can be formed on layer 54/56.

Regardless of whether a one voltage layer or two voltage layer device is formed, it is desireable to position a protective metal shield at the location of the edge boundaries, and over any segmenting dividers in layer 64/66 (for a two voltage layer device) or layer 54/56 (for a one voltage layer device) and over the adhesive surrounding decoupling pad 80 during any laser ablation steps subsequent to formation of the boundaries and/or voltage layer segmentation to retain lower layer insulation/adhesive materials at those locations for structural purposes. Otherwise, any layers of insulation/adhesive materials beneath the locations of boundary or voltage plane segmentation sites will be ablated away down to any lower layer of metal.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An interconnect device for electronic components comprising:

a first pattern of conductive input/output leads bonded to a first sheet of dielectric on one side thereof;

a first conductive sheet bonded to said first dielectric sheet on the side thereof opposite to said leads;

a second pattern of conductive first voltage leads bonded to said dielectric layer on said one side thereof;

a plurality of first via holes extending through said first conductive sheet and said first dielectric sheet to at least some of said first voltage leads;

a third pattern of conductive second voltage leads bonded to said dielectric layer on said one side thereof;

electrically conductive material extending along said first via holes and over said first conductive sheet and cooperating with said first conductive sheet to define a first voltage plane and vias electrically interconnecting at least some of said first voltage leads with said first voltage plane;

a second dielectric sheet bonded to said first voltage plane; a second conductive sheet bonded to said second dielectric sheet;

a plurality of second via holes extending through said second conductive sheet, said second dielectric sheet, said first voltage plane and said first dielectric sheet to at least some of said second voltage leads;

electrically conductive material extending along said second via holes and over said second conductive sheet and cooperating with said second conductive sheet to define a second voltage plane and vias electrically connecting said second plurality of said leads with said second voltage plane; and first windows in said interconnect device at locations of said input/output leads, second windows in said interconnect device at locations of said first voltage leads and third windows in said interconnect device at locations of said second voltage leads, at least some of said input/output leads extending across some of said first windows, and at least some of said first voltage leads extending across some of said second windows, and at least some of said second voltage leads extending across some of said third windows, said first, second and third windows forming sites, respectively, for connection of said input/output leads and said first and second voltage leads to an electronic component.

2. An interconnect device for electronic components as in claim 1 wherein:

said second via holes and the electrically conductive material extending along said second via holes pass through an opening in said first voltage plane of larger cross section than said second via holes and are surrounded by insulating material to prevent electrical contact between the conductive material in said second via holes and said first voltage plane.

3. An interconnect device for electronic components as in claim 1 wherein:

said input/output leads are located about the periphery of the interconnect device; and said first and second voltage leads are located interiorly of said input/output leads.

4. An interconnect device for electronic components as in claim 1 wherein:

said first and second voltage leads are located in predetermined patterns within an area defined by said input/output leads.

5. An interconnect device for electronic components as in claim 1 wherein:

said windows formed at locations of said first and second voltage leads are within an area defined by said windows formed at locations of said input/output leads.

6. An interconnect device for electronic components as in claim 1 wherein said windows at locations of said input/output leads includes:

a first window exposing a first part of said input/output leads; and a second window spaced from and surrounding said first window and defining at least a first frame between said first and second windows, said second window exposing a second part of said input/output leads.

7. An interconnect device for electronic components as in claim 1 wherein:

with respect to any second via, the opening in the second conductive sheet for the second via hole is smaller in cross section than the corresponding opening for that second via in the first voltage plane, whereby a space is defined in said first voltage plane surrounding and spacing the second via from the first voltage plane where the second via passes between the first voltage plane, said space being filled with an insulating material.

8. An interconnect device for electronic components as in claim 1 including:

decoupling capacitor means connected between said first voltage plane and said second voltage plane.

9. An interconnect device for electronic components as in claim 1 including:

decoupling capacitor means connected between said first voltage plane and said second voltage plane;

decoupling interconnect lead means in said device;

a first plate of said decoupling capacitor means being connected directly to said second voltage plane; and a second plate of said decoupling capacitor means being connected to said first voltage plane by a first via connected from said first voltage plane to said decoupling interconnect lead means and a second via connected from said second plate to said decoupling interconnect lead means.

10. An interconnect device as in claim 9 including:

an electrically isolated island formed in said second voltage plane;

said second plate of said capacitor and said second via and said first voltage plane each being connected to said electrically isolated island.

11. An interconnect device for electronic components comprising:

a first laminate of a first dielectric layer bonded to a first conductive layer;

a plurality of input/output leads bonded to said first dielectric layer;

a plurality of first voltage leads bonded to said first dielectric layer;

a plurality of second voltage leads bonded to said first dielectric layer;

a plurality of first vias extending from said first conductive layer to a plurality of said first voltage leads, said first vias including a first layer of conductive material in said first vias and extending over said first conductive layer;

said first conductive layer and said conductive material extending thereover defining a first voltage plane;

a second laminate having a second dielectric layer bonded to a second conductive layer, said second dielectric layer being bonded to said first voltage plane;

a plurality of second vias extending from said second conductive layer and through openings in said first conductive layer to a plurality of second voltage leads, said second vias including a second layer of conductive material in said second vias and extending over said second conductive layer;

said second conductive layer and said second conductive material extending thereover defining a second voltage plane;

a plurality of first, second and third windows in said interconnect device at, respectively, locations of said input/output leads, said first voltage leads and said second voltage leads; and at least some of said input/output leads extending across at least some of said first windows, and at least Some of said first voltage leads extending across aid second windows, and at least some of said second voltage leads extending across at least some of said third windows, said first, second and third windows forming sites for connection of said input/output leads and said first and second voltage leads to an electrical component.

12. An interconnect device for electronic components as in claim 11 wherein:

said second vias and the electrically conductive material of said second vias pass through an opening in said first voltage plane of larger cross section than said second vias and are surrounded by insulating material to prevent electrical contact between the conductive material in said second vias and said first voltage plane.

13. An interconnect device for electronic components as in claim 11 wherein:

said first, second and third windows extend through said second voltage plane, said second dielectric sheet, said first voltage plane and said first dielectric sheet, said windows exposing at least some of said input/output leads and said first and second voltage leads.

14. An interconnect device for electronic components as in claim 13 wherein:

some of said windows cooperate to define at least a first frame between spaced windows exposing said input/output leads.

15. An interconnect device for electronic components as in claim 11 wherein:

with respect to any second via, the opening in the second conductive sheet for the second via hole is smaller in cross section then the corresponding opening for that second via in the first voltage plane, whereby a space is defined in said first voltage plane surrounding and spacing the second via from the first voltage plane where the second via passes between the first voltage plane, said space being filled with an insulating material.

16. An interconnect device for electronic components as in claim 11 including:

decoupling capacitor means connected between said first voltage plane and said second voltage plane.

17. An interconnect device for electronic components as in claim 11 including:

decoupling capacitor means connected between said first voltage plane and said second voltage plane;

decoupling interconnect lead means in said device;

a first plate of said decoupling capacitor means being connected directly to said second voltage plane; and a second plate of said decoupling capacitor means being connected to said decoupling interconnect lead means by a first via connected from said first voltage plane to said decoupling interconnect lead and a second via connected from said second plate to said decoupling interconnect lead means.

18. An interconnect device as in claim 17 including:

an electrically isolated island formed in said second voltage plane;

said second plate of said capacitor and said second via and said first voltage plane each being connected to said electrically isolated island.

19. An interconnect device for electronic components as in claim 11 wherein:

said input/output leads are located about the periphery of the interconnect device; and said first and second voltage leads are located interiorly of said input/output leads.

20. An interconnect device for electronic components as in claim 11 wherein:

said first and second voltage leads are located in predetermined patterns within an area defined by said input/output leads.

21. An interconnect device for electronic components as in claim 11 wherein:

said windows formed at locations of said first and second voltage leads are within an area defined by said windows formed at locations of said input/output leads.

22. An interconnect device for electronic components, including:

a plurality of input/output leads in a first layer of said device;

a plurality of first voltage leads in said first layer;

a plurality of second voltage leads in said first layer;

a first voltage plane in a second layer of said device;

a second voltage plane in a third layer of said device;

a plurality of first vias extending from said first voltage plane to said first voltage leads and electrically connecting said first voltage plane to said first voltage leads;

a plurality of second vias extending from said second voltage plane to said second voltage leads and electrically connecting said second voltage plane to said second voltage leads;

a plurality of first, second and third windows in said interconnect device at, respectively, locations of said input/output leads, said first voltage leads and said second voltage leads; and at least some of said input/output leads extending across at least some of said first windows, and at least some of said first voltage leads extending across aid second windows, and at least some of said second voltage leads extending across at least some of said third windows, said first, second and third windows forming sites for connection of said input/output leads and said first and second voltage leads to an electrical component.

23. An interconnect device for electronic components as in claim 22 wherein:

said input/output leads are located about the periphery of the interconnect device; and said first and second voltage leads are located interiorly of said input/output leads.

24. An interconnect device for electronic components as in claim 22 wherein:

said first and second voltage leads are located in predetermined patterns within an area defined by said input/output leads.

25. An interconnect device for electronic components as in claim 22 wherein:

said windows formed at locations of said first and second voltage leads are within an area defined by said windows formed at locations of said input/output leads.

26. An interconnect device for electronic components as in claim 22 wherein:

said second vias pass through said second and third layers, each of said second vias passing through an insulating portion of said second voltage plane of larger cross section than said second vias.

27. An interconnect device for electronic components as in claim 22 including:

decoupling capacitor means connected between said first voltage plane and said second voltage plane;

decoupling interconnect lead means in said device;

a first plate of said decoupling capacitor means being connected directly to said second voltage plane; and a second plate of said decoupling capacitor means being connected to said first voltage plane by a first via connected from said first voltage plane to said decoupling interconnect lead means and a second via connected from said second plate to said decoupling interconnect lead means.

28. An interconnect device as in claim 22 including:

an electrically isolated island formed in said second voltage plane;

said second plate of said capacitor and said second via and said first voltage plane each being connected to said electrically isolated island.

29. An interconnect device for electronic components as in claim 22 wherein:

at least some of said first voltage leads and/or said second voltage leads include a buss section with individual leads extending therefrom.

30. An interconnect device for electronic components as in claim 29 wherein:

said buss sections are in electrical contact with respective ones of said first and/or second vias.

31. An interconnect device for electronic components as in claim 22 including:

a plurality of windows in said interconnect device at locations of said input/output leads, said first voltage leads and said second voltage leads, said windows defining sites for connection of said input/output leads and said first and second voltage leads to an electronic component.

32. An interconnect device for electronic components as in claim 31 wherein:

said second via holes and the electrically conductive material extending along said second via holes pass through an opening in said first voltage plane of larger cross section than said second via holes and are surrounded by insulating material to prevent electrical contact between the conductive material in said second via holes and said first voltage plane.

33. An interconnect device for electronic components as in claim 31 wherein:

said input/output leads are located about the periphery of the interconnect device; and said first and second voltage leads are located interiorly of said input/output leads.

34. An interconnect device for electronic components as in claim 31 wherein:

said first and second voltage leads are located in predetermined patterns within an area defined by said input/output leads.

35. An interconnect device for electronic components as in claim 31 wherein:

said second vias pass through said second and third layers each of said second vias passing through an insulating portion of said second voltage plane of larger cross section than said second vias.

36. An interconnect device for electronic components as in claim 31 including:

decoupling capacitor means connected between said first voltage plane and said second voltage plane;

decoupling interconnect lead means in said device;

a first plate of said decoupling capacitor means being connected directly to said second voltage plane; and a second plate of said decoupling capacitor means being connected to said first voltage plane by a first via connected from said first voltage plane to said decoupling interconnect lead means and a second via connected from said second plate to said decoupling interconnect lead means.

37. An interconnect device as in claim 31 including:

an electrically isolated island formed in said second voltage plane;

said second plate of said capacitor and said second via and said first voltage plane each being connected to said electrically isolated island.

38. An interconnect device for electronic components, including:

a plurality of input/output leads in a first layer of said device;

a plurality of at least first voltage leads in said first layer;

at least a first voltage plane in a second layer of said device, said first voltage leads being arranged in an array in an area defined at least in part by said input/output leads;

a plurality of at least first vias extending from said first voltage plane to said first voltage leads and electrically connecting said first voltage plane to said first voltage leads;

a plurality of at least first and second windows in said interconnect device at, respectively, locations of said input/output leads and said first voltage leads; and at least some of said input/output leads extending across at least some of said first windows, and at least some of said first voltage leads extending across at least some of said second windows, said first and second windows forming sites for connection of said input/output leads and said first voltage leads to an electrical component.

39. An interconnect device for electronic components as in claim 38 wherein:

said input/output leads are located about the periphery of the interconnect device; and said first voltage leads are located interiorly of said input/output leads.

40. An interconnect device for electronic components as in claim 38 wherein:

said first voltage leads are located in predetermined patterns within an area defined by said input/output leads.

41. An interconnect device for electronic components as in claim 38 including:

said first voltage plane being segmented into a plurality of voltage plane segments; and decoupling capacitor means connected between first and second of said voltage plane segments.

42. An interconnect device for electronic components as in claim 38 wherein:

at least some of said first voltage leads include a buss section with individual leads extending therefrom.

43. An interconnect device for electronic components as in claim 42 wherein:

said buss sections are in electrical contact with respective ones of said first vias.

44. An interconnect device for electronic components as in claim 38 wherein:

said input/output leads are located about the periphery of the interconnect device; and said first voltage leads are located interiorly of said input/output leads.

45. An interconnect device for electronic components as in claim 38 wherein:

said first voltage leads are located in predetermined patterns within an area defined by said input/output leads.

46. An interconnect device for electronic components as in claim 38 including:

said first voltage plane being segmented into a plurality of voltage plane segments; and decoupling capacitor means connected between first and second of said voltage segments.

* * * * *